(12) United States Patent
Chen et al.

(10) Patent No.: US 12,300,731 B2
(45) Date of Patent: May 13, 2025

(54) MULTIGATE DEVICE WITH AIR GAP SPACER AND BACKSIDE RAIL CONTACT AND METHOD OF FABRICATING THEREOF

(71) Applicant: Taiwan Semiconductor Manufacturing Co., Ltd., Hsinchu (TW)

(72) Inventors: Guan-Lin Chen, Hsinchu County (TW); Kuo-Cheng Chiang, Hsinchu County (TW); Shi Ning Ju, Hsinchu (TW); Chih-Hao Wang, Hsinchu County (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/446,151

(22) Filed: Aug. 8, 2023

(65) Prior Publication Data

US 2023/0387236 A1   Nov. 30, 2023

Related U.S. Application Data

(62) Division of application No. 17/302,395, filed on Apr. 30, 2021, now Pat. No. 11,984,488.

(Continued)

(51) Int. Cl.
*H01L 29/00* (2006.01)
*H01L 29/06* (2006.01)
*H01L 29/40* (2006.01)
*H01L 29/417* (2006.01)
*H01L 29/423* (2006.01)
(Continued)

(52) U.S. Cl.
CPC .... *H01L 29/42392* (2013.01); *H01L 29/0649* (2013.01); *H01L 29/401* (2013.01); *H01L 29/41733* (2013.01); *H01L 29/66545* (2013.01); *H01L 29/66553* (2013.01); *H01L 29/78696* (2013.01)

(58) Field of Classification Search
CPC .......... H01L 29/42392; H01L 29/0673; H01L 29/66545
See application file for complete search history.

(56) References Cited

U.S. PATENT DOCUMENTS 7,612,638 B2   11/2009   Chung et al.
9,608,065 B1   3/2017    Bergendahl
(Continued)

FOREIGN PATENT DOCUMENTS

CN   108257871 A   7/2018
CN   108933102 A   12/2018
(Continued)

*Primary Examiner* — Reema Patel
(74) *Attorney, Agent, or Firm* — Haynes and Boone, LLP

(57) ABSTRACT

Methods and devices that include a multigate device having a channel layer disposed between a source feature and a drain feature, a metal gate that surrounds the channel layer, and a first air gap spacer interposing the metal gate and the source feature and a second air gap spacer interposing the metal gate and the drain feature. A backside contact extends to the source feature. A power line metallization layer is connected to the backside contact.

20 Claims, 33 Drawing Sheets

Related U.S. Application Data

(60) Provisional application No. 62/706,099, filed on Jul. 31, 2020.

(51) Int. Cl.
    *H01L 29/66*     (2006.01)
    *H01L 29/786*     (2006.01)

(56) References Cited

U.S. PATENT DOCUMENTS

| | | |
|---|---|---|
| 9,633,999 B1 | 4/2017 | Lu |
| 10,269,965 B1 | 4/2019 | Chen |
| 10,580,692 B1 | 3/2020 | Park et al. |
| 2007/0274654 A1 | 11/2007 | Choudhury et al. |
| 2014/0054713 A1* | 2/2014 | Lee .................... H01L 27/1211 257/368 |
| 2015/0194427 A1 | 7/2015 | Sengupta |
| 2015/0235940 A1 | 8/2015 | Chen et al. |
| 2016/0056232 A1 | 2/2016 | Kuo |
| 2016/0077293 A1 | 3/2016 | Jou et al. |
| 2016/0087059 A1 | 3/2016 | Hsieh |
| 2016/0190312 A1 | 6/2016 | Zhang et al. |
| 2017/0141112 A1 | 5/2017 | Ching |
| 2018/0331232 A1 | 11/2018 | Frougier et al. |
| 2019/0148376 A1 | 5/2019 | Chanemougame |
| 2019/0334008 A1 | 10/2019 | Chen |
| 2020/0006155 A1 | 1/2020 | Chiang |
| 2020/0020692 A1 | 1/2020 | Ching |
| 2020/0075428 A1 | 3/2020 | Venigalla |
| 2020/0083101 A1 | 3/2020 | Park |
| 2020/0127109 A1 | 4/2020 | Wang et al. |
| 2020/0135634 A1 | 4/2020 | Chiang |
| 2020/0176560 A1 | 6/2020 | Yu et al. |

FOREIGN PATENT DOCUMENTS

| | | |
|---|---|---|
| KR | 20170044525 A | 4/2017 |
| KR | 20180128986 A | 12/2018 |
| KR | 20190015269 A | 2/2019 |
| KR | 20190036521 A | 4/2019 |
| KR | 20190056907 A | 5/2019 |
| WO | 2018004653 A1 | 1/2018 |

* cited by examiner

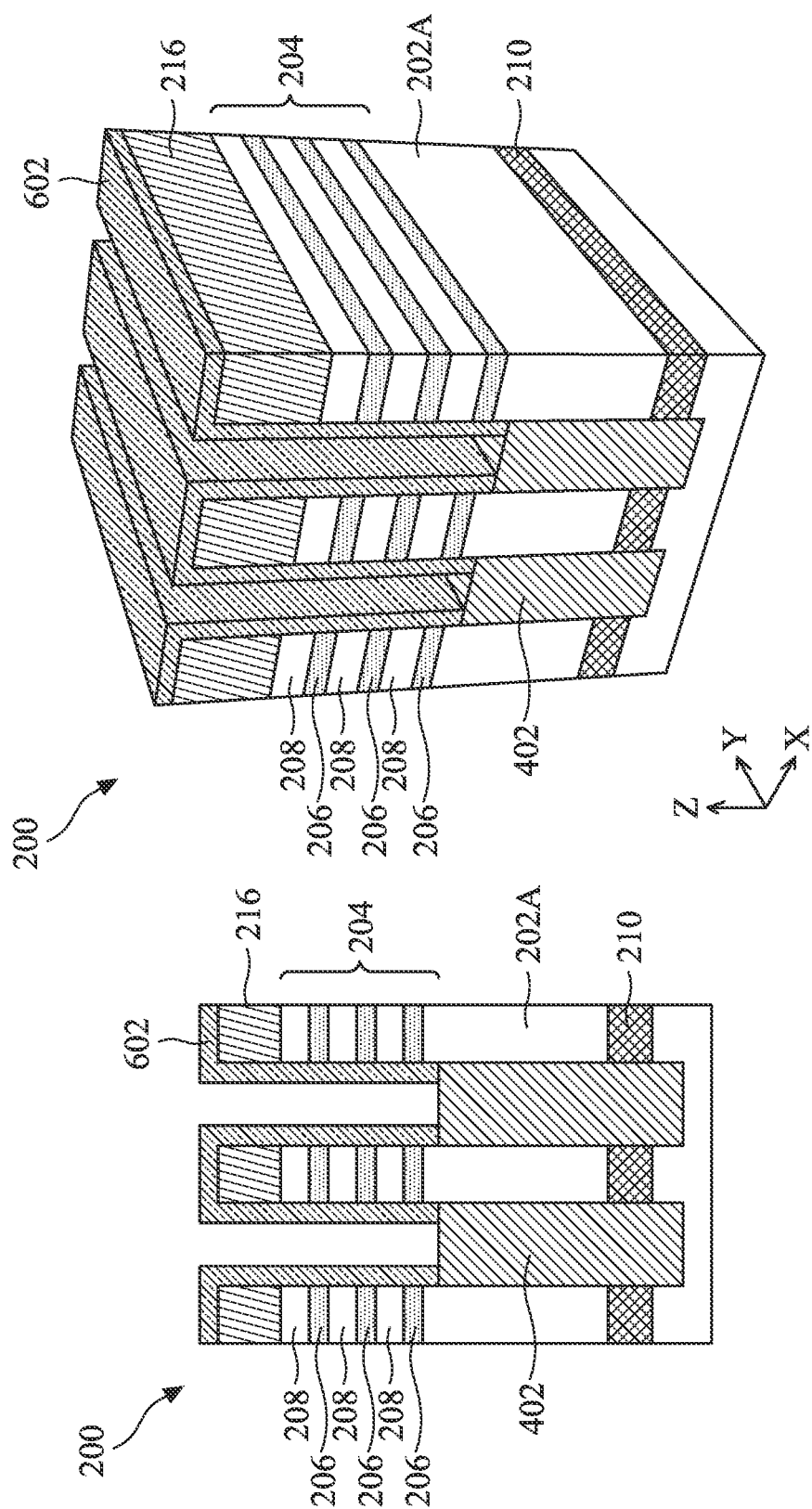

MULTIGATE DEVICE WITH AIR GAP SPACER AND BACKSIDE RAIL CONTACT AND METHOD OF FABRICATING THEREOF

PRIORITY

This application is a divisional application of U.S. patent application Ser. No. 17/302,395, filed Apr. 30, 2021, and claims benefit of U.S. Provisional Patent Application Ser. No. 62/706,099, filed Jul. 31, 2020, the entire disclosures of which are incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. However, as GAA devices continue to scale, challenges arise in achieving desired gate density and performance. For example, devices scale down smaller conductive features can increase in resistance, smaller dielectric features can result in higher capacitance each affecting device performance. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3A, 4A, 5A, 6A, 7A, 8A, 9A, and 10A are fragmentary cross-sectional views of the multigate device of, in portion or entirety, at various fabrication stages (such as those associated with the method in FIG. 1) according to various aspects of the present disclosure.

FIGS. 3B, 4B, 5B, 6B, 7B, 8B, 9B, 10B, 11, 12, 13, 14, 15, 16, 17, 18, 19, 20A, 20B, 21A, 21B, 22A, 22B, 23, 24, 25, 26A, 27A, 28A, 29, and 30A are fragmentary perspective views of a multigate device, in portion or entirety, at various fabrication stages (such as those associated with the method in FIG. 1) according to various aspects of the present disclosure.

FIGS. 26B, 27B, 28B, 30B, and 30C are fragmentary cross-sectional views of a portion of the multigate device corresponding to the aspects of FIGS. 26A, 27A, 28A, and 30A respectively.

DETAILED DESCRIPTION

Figure 1:
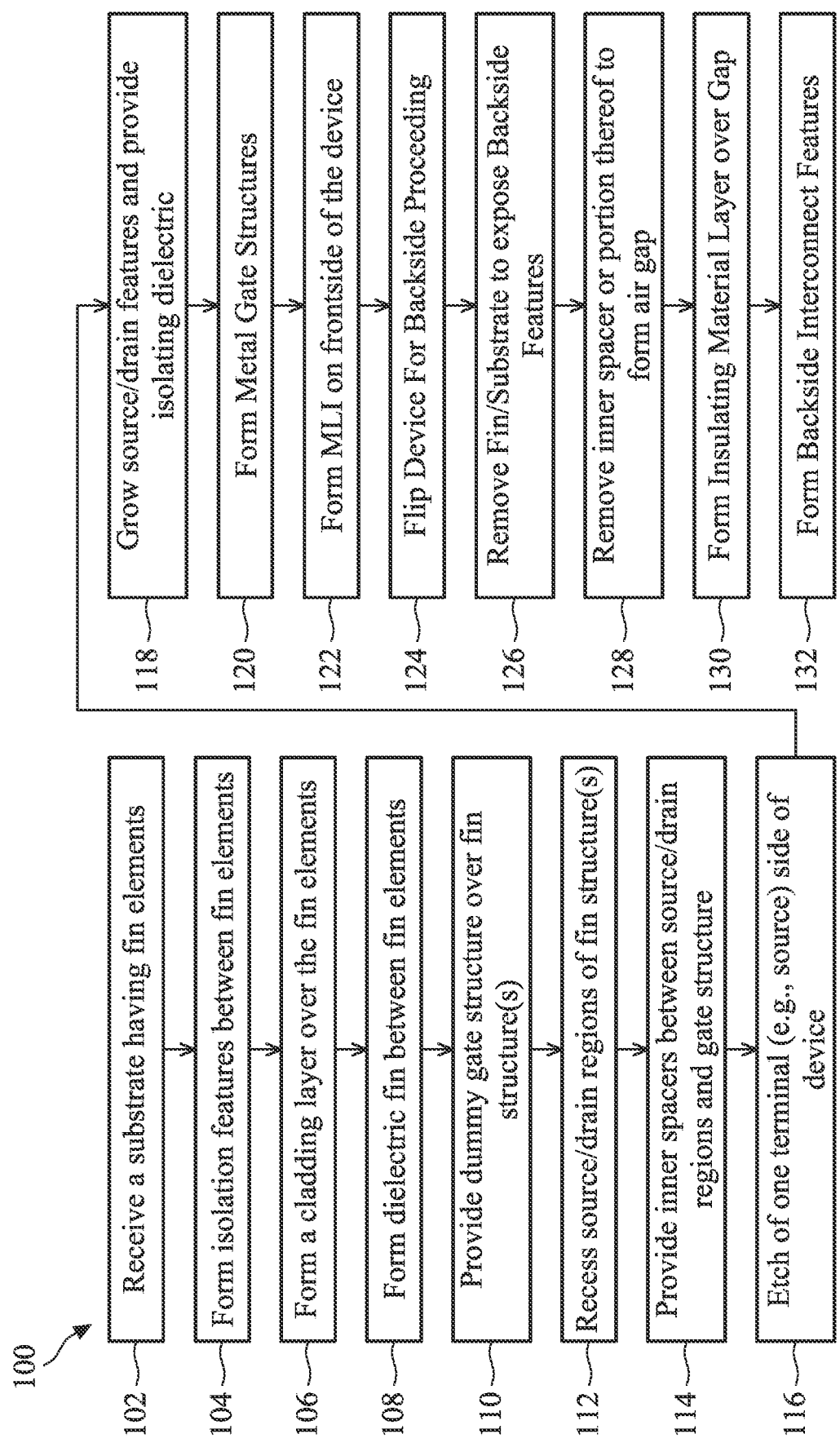
FIG. 1 is a flow chart of a method for fabricating a multigate device according to various aspects of the present disclosure.

The present disclosure relates generally to integrated circuit devices, and more particularly, to techniques for fabricating and resulting multigate devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," "front," "back" etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

As devices decrease in dimension, the associated metal interconnect lines, also shrinking, can increase in resistance. One technique for reducing the resistance of metallization lines presented it the descriptions that follow is to provide the routing on a backside of the device allowing for additional real estate and thus, the increase of metallization line size. One functionality for metal routing that may be benefit from such a configuration is a power rail. By configuring the power rail at the backside of the device, a higher gate density (e.g., gates more tightly packed on the device) may also be achieved due to the additional routing space. Further, the width of the metallization line of the power rail can be increased when disposed on the backside of the device. This is because the power rail is not constrained by the M0 routing of the frontside of the device. In some implementations, the width of the backside power rail may be greater than twice that of a similarly configured frontside power rail. The greater the width of the metallization line, the lower its resistance thus impacting the IR drop and consequently the circuit performance.

Further improvements discussed in one or more embodiments herein provide for an air gap interposing the gate structure and source/drain region. The air gap can allow for a reduction in capacitance in comparison with other inner spacer configurations as the dielectric constant of air nears 1. The air gap inner spacer can provide for device performance enhancements that allow for AC reduction, as well as speed improvements for the resultant device.

Thus, the present disclosure thus proposes a methods and devices that provide for an inner spacer that is formed at least in part of an air gap, and/or a backside metallization (e.g., power rail) routing. In some implementations, the air gap inner spacer is created during the backside processing of the device. During the backside processing of the device, in some implementations, the selective removal of some or all of inner spacers formed during the fabrication of the device features (e.g., gate, source/drain)) is performed. The previous inner spacers are replaced with air, having a dielectric constant near 1, which advantageously reduces the capacitance of the device as discussed above. In some embodiments, the methods include forming a dielectric fin that separates a first GAA device (in particular, a first metal gate of the first GAA device) from a second GAA device (in particular, a second metal gate of the second GAA device). Air gap inner spacers may further be provided between a gate and the dielectric fin also providing benefits of a low dielectric constant within the space. Details of the proposed air gap inner spacer and backside interconnections for power rail techniques for fabrication GAA devices and resulting GAA devices are described herein in the following pages and/or drawings. It is noted that while a multigate device including GAA transistors is used for the following explanation, it can be appreciated that other device types such as fin-type field effect transistors (FinFETs) may also be provided by the present methods and devices. Further, the GAA devices described herein may include n-type field effect transistors (NFET) and/or p-type field effect transistors (PFET).

FIG. 1 is a flow chart of an embodiment of a method 100 for fabricating a multigate device according to various aspects of the present disclosure. In some embodiments, method 100 fabricates a device including a plurality of gate-all-around (GAA) transistors. Method 100 is exemplary only and is not intended to limit the present disclosure to what is explicitly illustrated therein. Additional steps can be provided before, during, and after method 100, and some steps described can be replaced, eliminated, or moved around for additional embodiments of the method. Not all steps are described herein in detail for reasons of simplicity. Besides what are explicitly shown in figures of the present disclosure, the semiconductor device 200 may include additional transistors, bipolar junction transistors, resistors, capacitors, diodes, fuses, etc. Multigate device 200 or portion thereof can be included in a microprocessor, a memory, and/or other IC device. In some embodiments, multigate device 200 is a portion of an IC chip, a system on chip (SoC), or portion thereof. The exemplary figures of the multigate 200 have been simplified for the sake of clarity to better understand the inventive concepts of the present disclosure. Additional features can be added in multigate device 200, and some of the features described below can be replaced, modified, or eliminated in other embodiments of multigate device 200. Outside of the specifically noted differences of exemplary devices 200, 200', 200", and 200'", a description of one of the devices applies to the other exemplary devices. Throughout the present disclosure, like reference numerals denote like features unless otherwise excepted or described.

The method 100 begins at block 102 where a substrate is received having a plurality of fin structures formed thereon. Referring to the example of FIG. 2, a substrate 202 is provided. In an embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. An ion implantation process, a diffusion process, and/or other suitable doping process can be performed to form the various doped regions.

Figure 2:
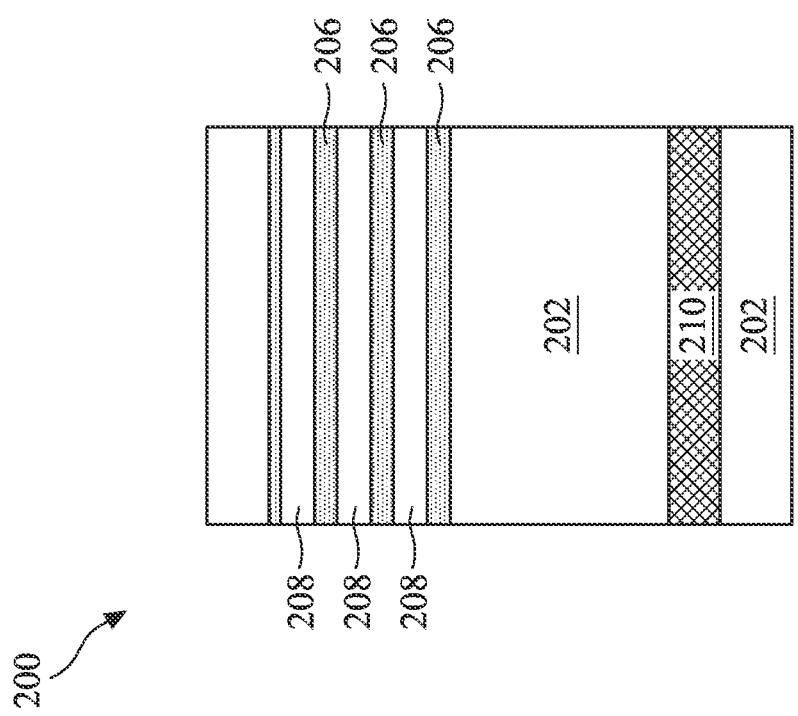

Referring still to FIG. 2, a stack 204 of epitaxial layers may be disposed on the substrate 202. The stack 204 may include a plurality of semiconductor layers 208 interleaved by a plurality of sacrificial layers 206. As described further below, semiconductor layers 208 or portions thereof form channel regions of multigate device 200, and thus, are referred to as channel layers 208. The channel layers 208 and the sacrificial layers 206 may have different semiconductor compositions. The sacrificial layers 206 and the channel layers 208 are deposited alternatingly, one-after-another, to form the stack 204. In some implementations, the channel layers 208 are formed of silicon (Si) and sacrificial layers 206 are formed of silicon germanium (SiGe). In some implementations, the additional germanium content in the sacrificial layers 206 allow selective removal or recess of the sacrificial layers 206 without substantial damage to the channel layers 208, as discussed below. In some embodiments, the stack 204 including the sacrificial layers 206 and the channel layers 208 may be formed using an epitaxial process to deposit the materials. Exemplary techniques include but are not limited to CVD deposition techniques (e.g., vapor-phase epitaxy (VPE) and/or ultra-high vacuum CVD (UHV-CVD)), molecular beam epitaxy (MBE), and/or other suitable processes. It is noted that four (4) layers of the sacrificial layers 206 and four (4) layers of the channel layers 208 are alternately and vertically arranged in the illustration of FIG. 2. However, this is for illustrative purposes only and not intended to be limiting beyond what is specifically recited in the claims. The number of layers depends on the desired number of channels members for the semiconductor device 200. In some embodiments, the number of the channel layers 208 is between 2 and 10. The channel layers 208 and/or the sacrificial layers 206 may include a constant thickness or varying in thickness. The thickness may be selected based on the device 200 performance including the channel dimensions (layers 208), the gate height (layers 206), and the desired air gap inner spacer height discussed below.

A buried etch stop layer 210 may also be disposed in the substrate. The buried etch stop layer 210 may also be epitaxially grown or may be formed by implantation into the substrate. In some embodiments, the buried etch stop layer 210 is the same composition as the sacrificial layers 206. In an embodiment, the buried etch stop layer 210 is silicon germanium (SiGe). Additional substrate material 202 is formed over the buried etch stop layer 210.

Figures 3A, 3B:
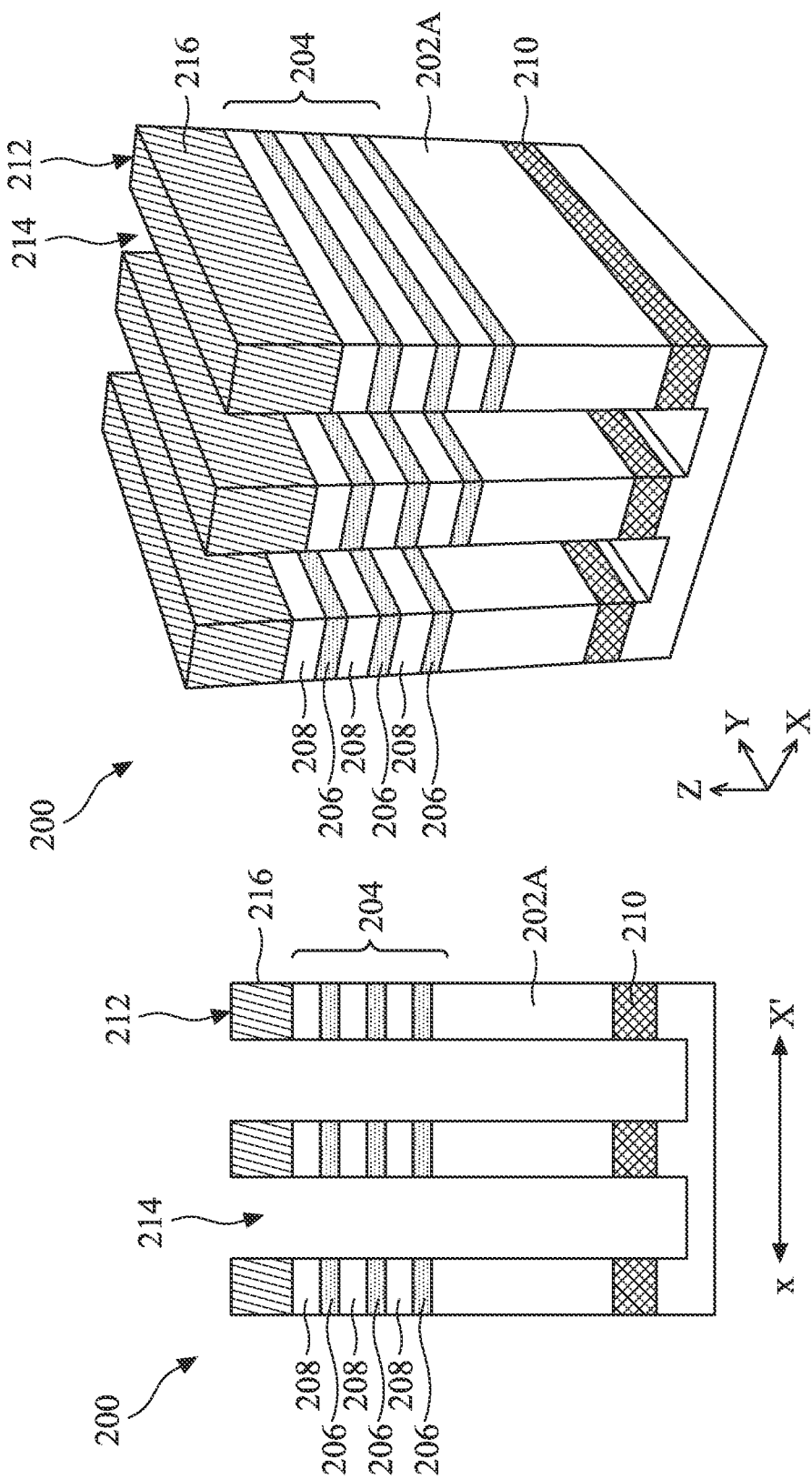

Referring now to the examples of FIGS. 3A and 3B, a plurality of fin structures 212 is formed from the substrate 202 and stack 204 of FIG. 2. Fin structures 212 each extend substantially parallel to one another along a y-direction, having a length defined in the y-direction, a width defined in an x-direction, and a height defined in a z-direction. Each of the fin structures 212 defines an active region on the substrate. Referring to the example of FIG. 2, fin structures 212 are formed of the epitaxial stack 204. While two (2) or four (4) fin structures are shown in the exemplary figures, this is for illustrative purposes only and not intended to be limiting beyond what is specifically recited in the claims. The fin structures 212 include the epitaxial stack 204, and also a portion of the underlying substrate, which is annotated 202A. Again, it is noted that the portion 202A above the buried etch stop layer 210 may be epitaxially grown layer of the substrate 202. In some implementations, portion 202A is silicon.

For patterning purposes, a hard mask layer 216 may be disposed over the stack 204. The hard mask layer 216 may be a single layer or a multilayer. In one implementation, the hard mask layer 216 includes a silicon oxide layer and a silicon nitride layer. In some embodiments, a lithography and/or etching process is performed to pattern a semiconductor layer stack to form fins 212. The lithography process can include forming a resist layer over semiconductor layer stack 204 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 204 using the patterned resist layer and/or hard mask layer 216 as an etch mask. The etching process can include a dry etching process, a wet etching process, other suitable etching process, or combinations thereof. In some embodiments, the etching process is a reactive ion etching (RIE) process. After the etching process, the patterned resist layer is removed, for example, by a resist stripping process or other suitable process. Alternatively, fin structures 212 are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Such processes can also provide fin structures 212 with hard mask layer 216, semiconductor layer stack 204, and fin portion 202A, as depicted in FIGS. 3A, 3B. In some embodiments, directed self-assembly (DSA) techniques are implemented while patterning semiconductor layer stack 204. Further, in some embodiments, the exposure process can implement maskless lithography, electron-beam (e-beam) writing, and/or ion-beam writing for patterning the resist layer. Each fin structure 212 is disposed between trenches 214 formed by the respective etching process.

The method 100 then proceeds to block 104 where isolation features such as shallow trench isolation (STI) features are formed between the fin structures. Referring to the example of FIGS. 4A, 4B, 5A, and 5B, shallow trench isolation features 402 are disposed in the trench 214. In an embodiment, the isolation material is multi-layer for example, including a liner layer and an overlying layer such as an oxide material. In some embodiments, oxide material is deposited by a flowable CVD (FCVD) process that includes, for example, depositing a flowable oxide material (for example, in a liquid state) over multigate device 200 and converting the flowable oxide material into a solid oxide material by an annealing process. The flowable oxide material can flow into trenches 214 and conform to exposed surfaces of multigate device 200, enabling in some implementations void free filling of trenches 214.

Figures 4A, 4B:
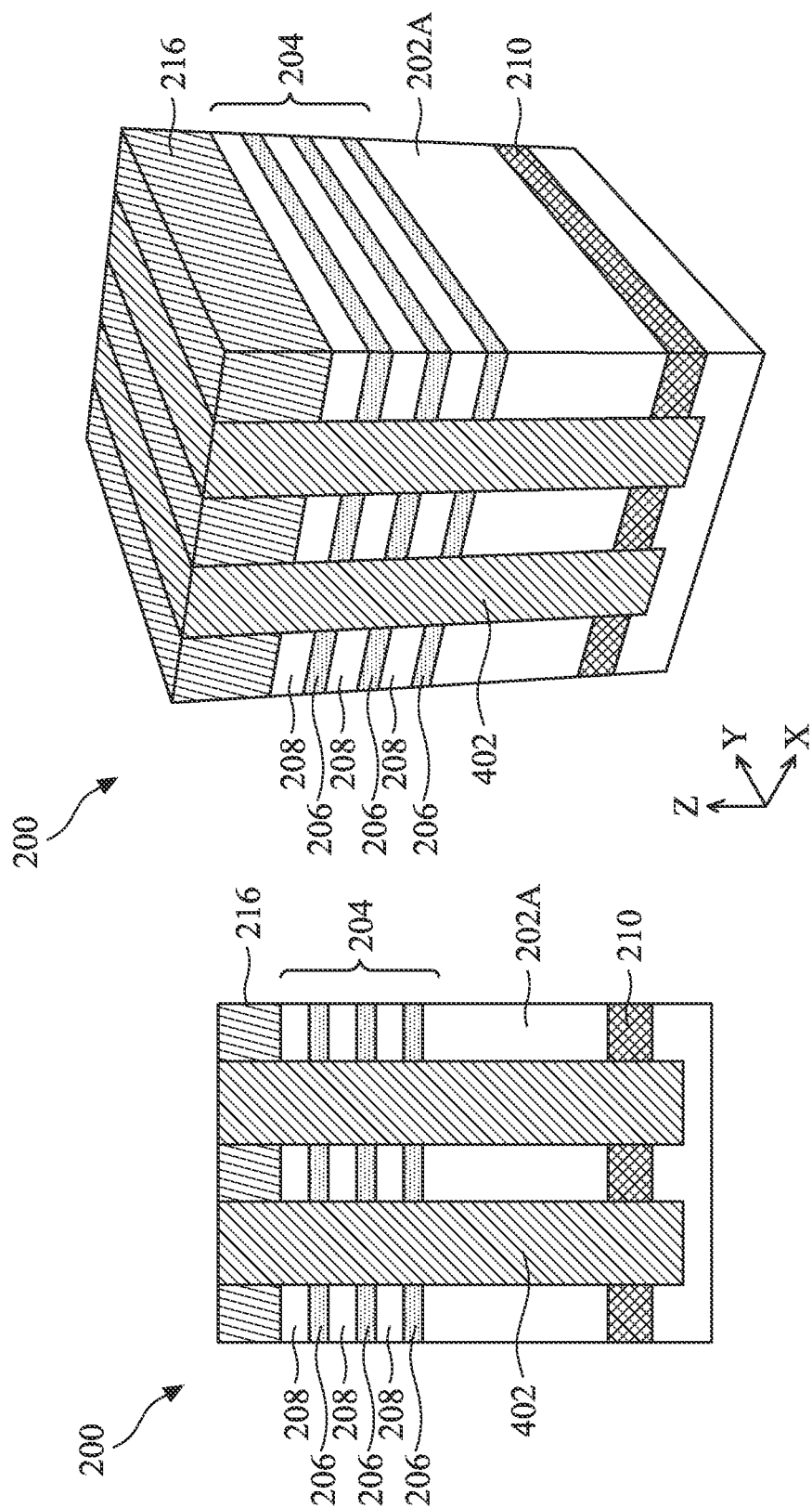
Figures 5A, 5B:
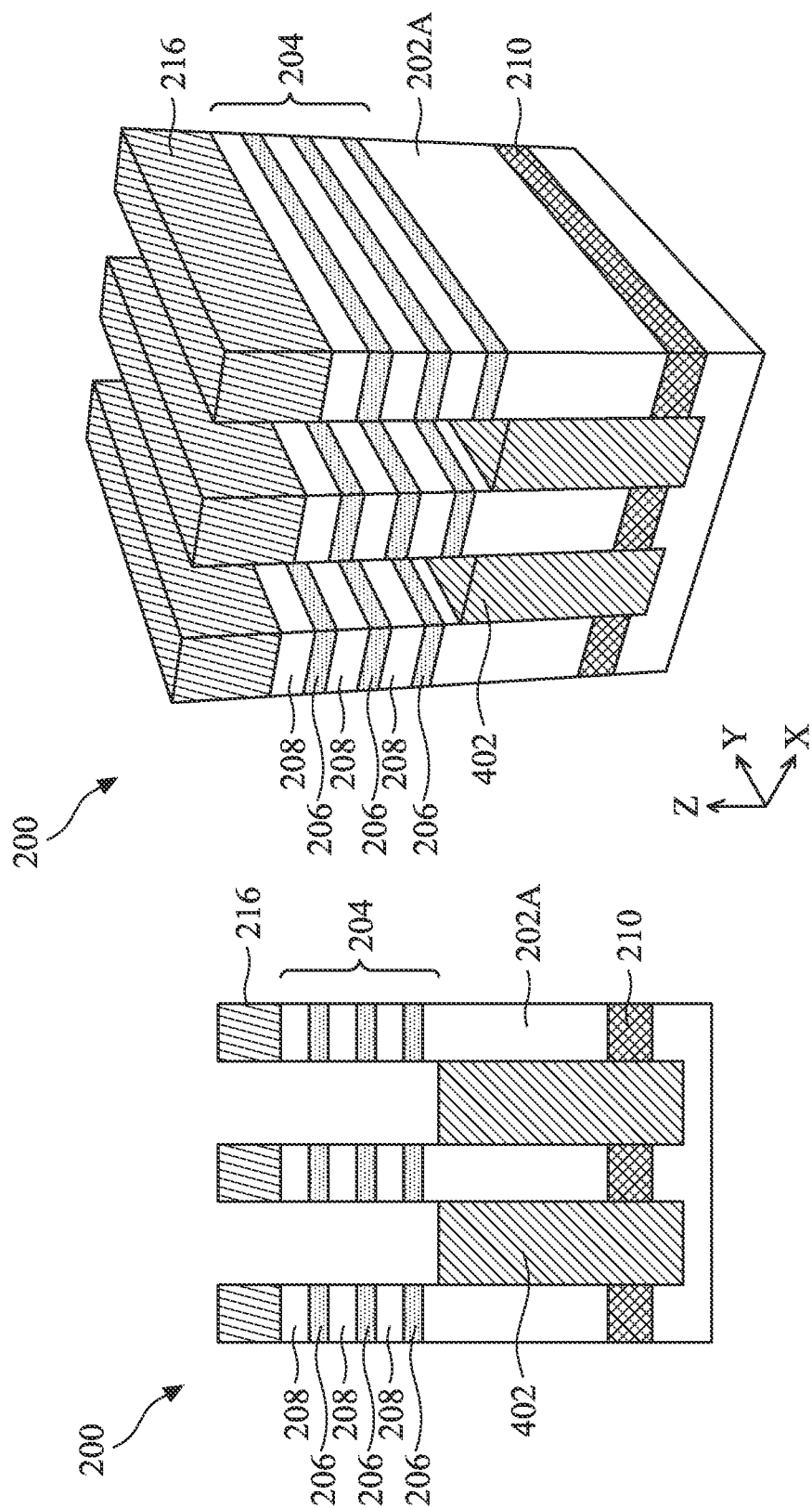

In some embodiments, the insulating material forming isolation layer 402 may include SiO2, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, or other suitable process. The deposition process can overfill trenches 214 (not shown) such that a thickness of the material for the isolation features 402 is greater than a height of fins 212. After the deposition process, the planarization process, such as a chemical mechanical polishing (CMP) process, is performed on the materials, thereby reducing the thickness. This planarization forms a surface such as illustrated in FIGS. 4A and 4B. In an embodiment, the planarization process is performed using an etch stop of the hard mask layer 216.

The formation of the isolation features may then continue to recess the deposited (and planarized) insulating material(s) to form the STI structures such that the fin structures extend above the STI structures. Referring to the example of FIGS. 5A and 5B, the insulating material(s) may then be recessed such that fin structures 212 extend (protrude) from between etched-back isolation features 402. The etching process to recess the isolation material is configured to selectively remove material (e.g., oxide) with respect to the fin structure 212. Thus, the isolation features 402 fill lower portions of the trenches 214 between the fin structure 212. In some embodiments, a field oxide, a LOCOS feature, and/or other suitable isolation features may additionally or alternatively be implemented on and/or within the substrate.

The method 100 then proceeds to block 106 where a cladding layer is formed over the fin structure. The cladding layer may be a sacrificial layer and may be formed over each fin structure. Referring to the example of FIGS. 6A and 6B, a cladding layer 602 is formed on each fin element 212. In some embodiments, the cladding layer 602 may have a composition similar to that of the sacrificial layers 206. In an embodiment, the cladding layer 602 is formed of silicon germanium (SiGe). In some implementations, the cladding layer 602 and the sacrificial layers 206 include a composition that allows selective removal of the sacrificial layers 206 and the cladding layer 602 during the release of channel layers 208 in a subsequent process by a single etching process, discussed below. In an embodiment, the cladding layer 602 may be epitaxially grown using vapor phase epitaxy (VPE), molecular bean epitaxy (MBE) or formed by a deposition process such as CVD process, a subatmospheric CVD (SACVD) process, a flowable CVD process, an ALD process, a PVD process, or other suitable process. After deposition, in some embodiments, operations at block 106 may include, after conformal deposition of the material for cladding layer 602, an etch back processes to remove material of the cladding layer 602 from on portions of the isolation feature 402 between fins. In some implementations, block 106 may be omitted. It is noted that other liner layers in addition to or in lieu of the cladding layer 602 may be formed over the fin structures 212, before or after the formation of the isolation features in block 104. In some embodiments, an oxide liner and/or a silicon liner may be formed over the fin structure 212 prior to formation of the isolation features 402.

Figures 7A, 7B:
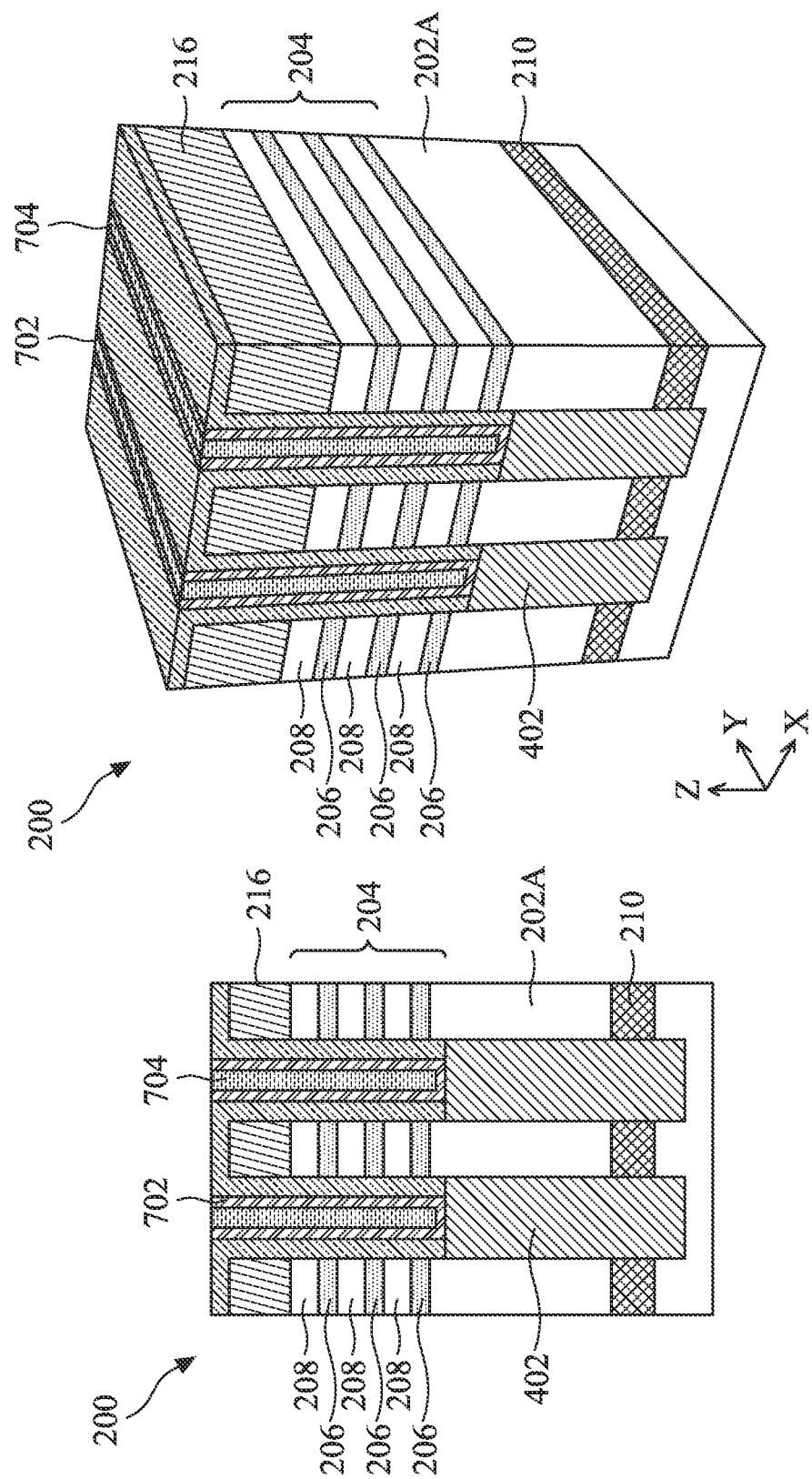

The method 100 then proceeds to block 108 where separation structures also referred to as dielectric fins, are formed between upper portions of the fin structures, thus separating the adjacent active regions and later serving to separate adjacent gate structures formed over said active regions where desired. The dielectric fins may include a multi-layer structure filling the gap between fin structures and be disposed over the STI features of block 104. FIGS. 7A, 7B, 8A, 8B, 9A, 9B, 10A, and 10B are illustrative of an embodiment of forming a multi-layer separation structure or dielectric fins between active regions. Referring first to the example of FIGS. 7A, 7B, a first dielectric layer 702 is deposited over the device 200. In an embodiment, the first dielectric layer 702 is a high-k dielectric. In an embodiment, the first dielectric layer 702 may be silicon nitride silicon carbonitride (SiCN), silicon oxycarbonitride (SiOCN), or combinations thereof. In some embodiments, dielectric layer 702 includes HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3, (Ba,Sr)TiO3, HfO2-Al2O3, other suitable high-k dielectric material, or combinations thereof. A second dielectric layer, such as an oxide layer, 704 may then be formed over the first dielectric layer 702. In some embodiments, the oxide layer 704 may be deposited by a flowable CVD, HARP, and/or other process providing suitable gap-filling properties. In some implementations, the trenches 214 may be overfilled with the oxide layer, and after deposition of the oxide layer 704, a CMP process may be performed providing a substantially planar top surface as illustrated in FIGS. 7A and 7B. In an embodiment, the cladding layer 602 provides an etch stop for this planarization process.

Figures 8A, 8B:
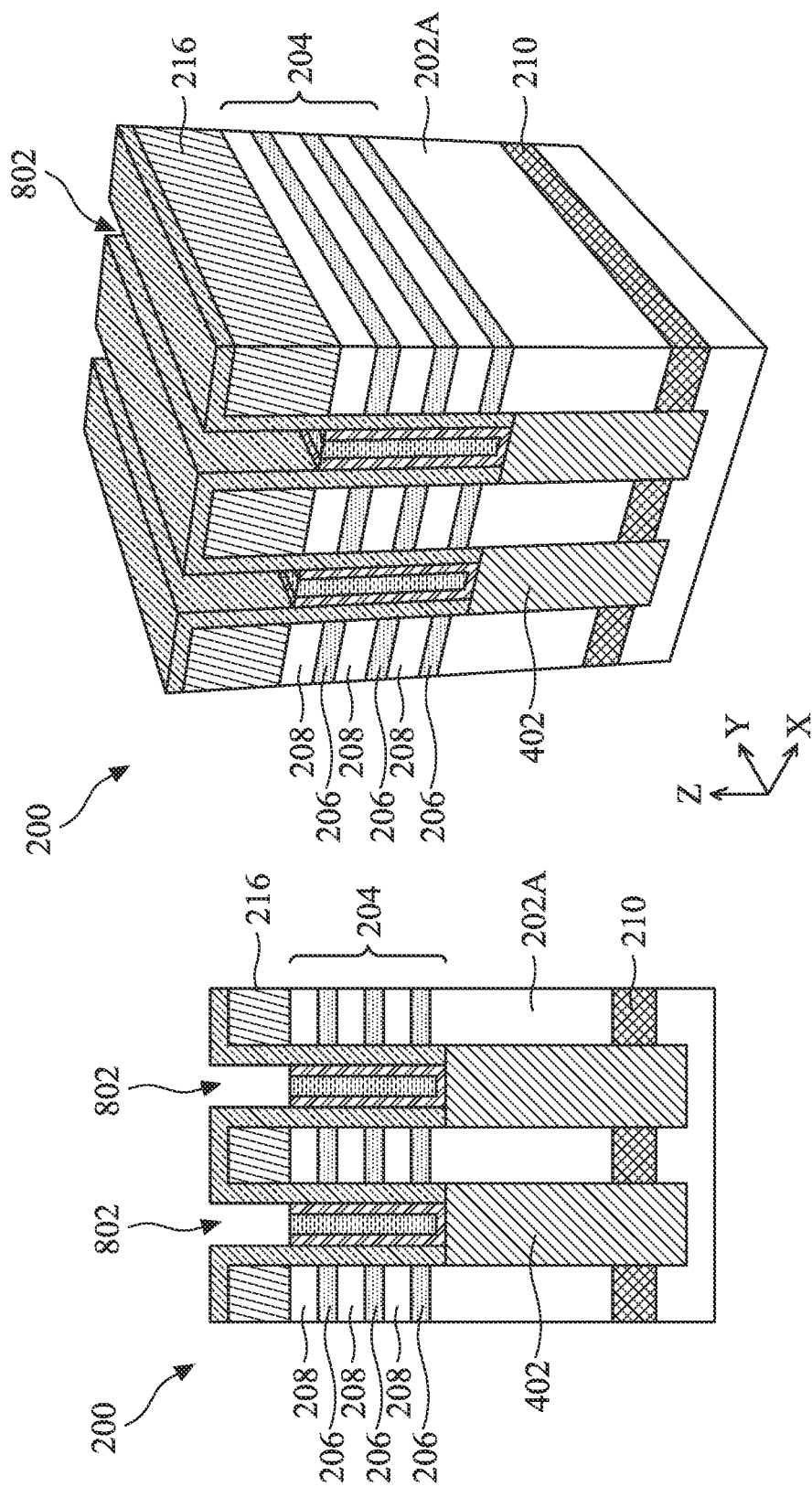

Continuing with the fabricating of the dielectric fins and referring to FIGS. 8A and 8B, the layers 702 and/or 704 are etched back forming an opening 802. In an embodiment, the oxide layer 704 is removed to form the opening 802, which has sidewalls defined by the first dielectric layer 702 and is confined with the trenches 214. In an embodiment, the layers 702 and 704 each removed forming the opening 802 as illustrated in FIGS. 8A, 8B. The etching process to form the opening 802 may be a dry etching process, a wet etching process, or a combination thereof.

Figures 9A, 9B:
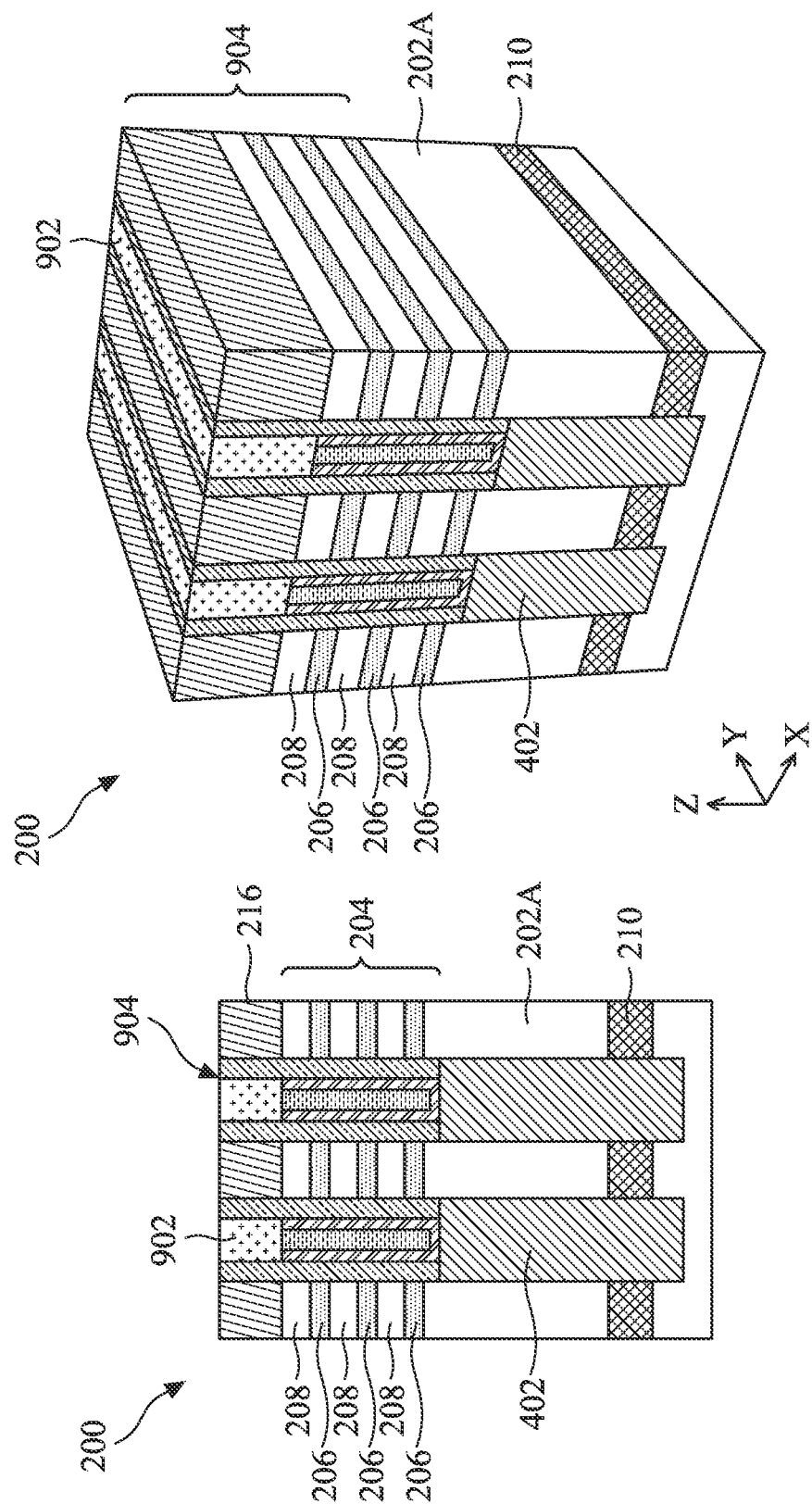

As illustrated in FIGS. 9A and 9B, a third dielectric material 902 of the dielectric fin is formed within the openings 802. The dielectric material 902 may be deposited such that it overflows the opening 802, and subsequently excess material be removed by a planarization process. In an embodiment, the dielectric material 902 is a high-k dielectric. In some embodiments, the dielectric material 902 is substantially the same composition as the first dielectric layer 702. In an embodiment, the dielectric material 902 may be silicon nitride silicon carbonitride (SiCN), silicon oxycarbonitride (SiOCN), or combinations thereof. In some embodiments, dielectric layer 702 includes HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3, (Ba,Sr)TiO3, HfO2-Al2O3, other suitable high-k dielectric material, or combinations thereof. The dielectric material 902 may be deposited by suitable process such as a subatmospheric CVD (SACVD) process, a flowable CVD process, other CVD process, an ALD process, a PVD process, or other suitable process. In some implementations, subsequent to the deposition, planarization process is performed thereby thinning the deposited dielectric material 902 to provide a planar top surface. In some implementations, the planarization process may stop at the hard mask 216.

The dielectric layers 702, 704, and 902, discussed above, together form the separation structure referred to as dielectric fin 904. The dielectric fin 904 extends between adjacent active regions, the fin structures 212, and more particularly between cladding layer 602 portions disposed on said adjacent fin structures 212. The dielectric fin 904 is referred to as such because, like the fin structures 212, the dielectric fins 904 extend vertically (Z-direction) above the substrate 202 (in particular above the isolation structure 402) and lengthwise along the Y-direction from the substrate 202 and are spaced from the adjacent dielectric fin 904 in the X-direction.

Figures 10A, 10B:
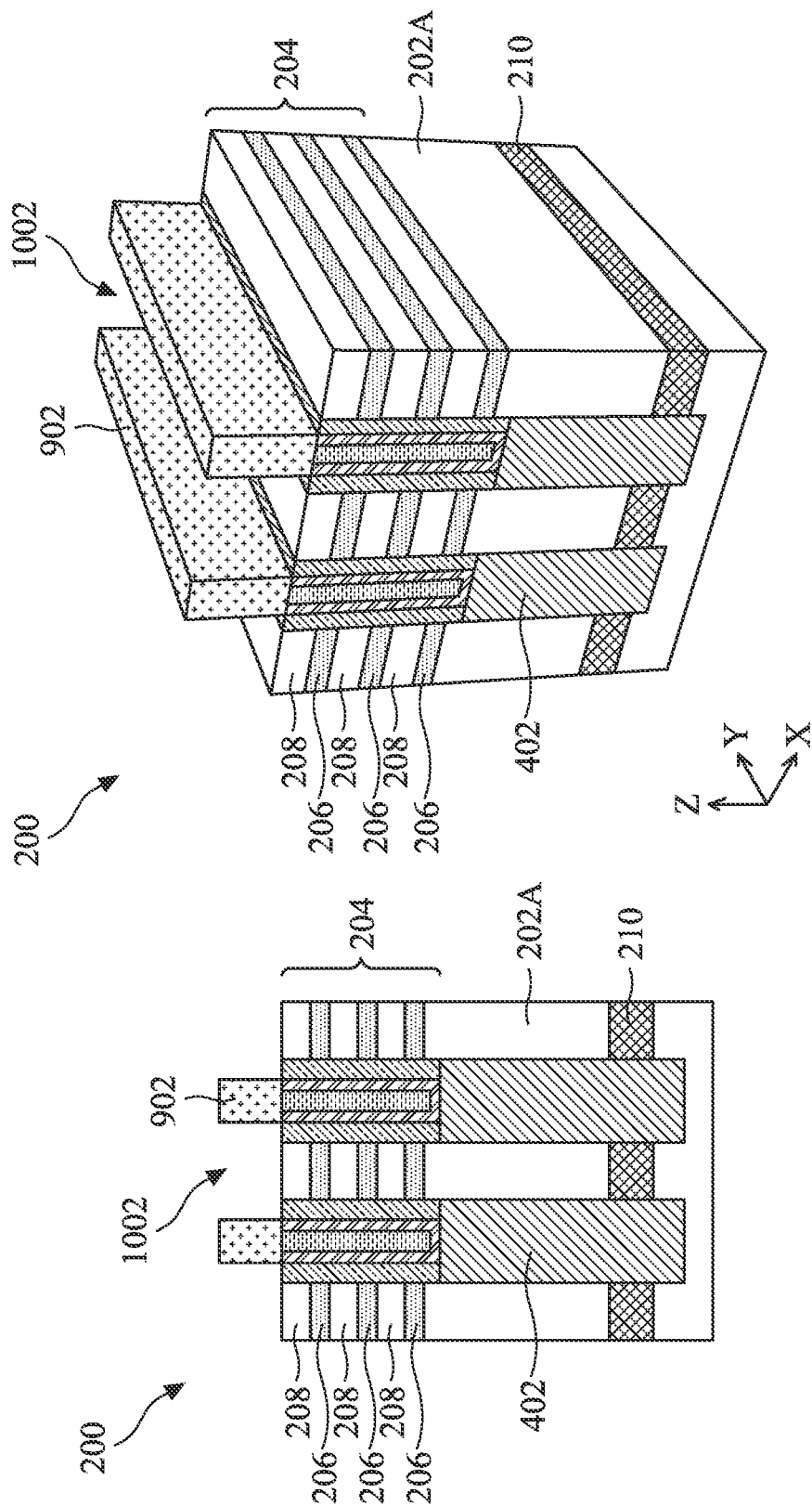

In some embodiments, after forming the dielectric fin 904 and prior to forming the dummy gate, the hard mask 216 and adjacent cladding layers 602 are etched to form an opening 1002 as illustrated FIGS. 10A and 10B. In some embodiments, the etching exposes an upper surface of an uppermost channel region 208 on which the gate structure can be formed as discussed below. The etching is selective to the hard mask 216 and the cladding layers 602, either by the use of a selective etchant or through the use of masking elements, such that the dielectric fins 904 remain.

The method 100 then proceeds to block 110 where a dummy gate structure is formed over the fin structures. Referring to the example of FIG. 11, dummy gate structures 1102 are formed over portions of fins 212 and dielectric fins 904. Dummy gate structures 1102 fill portions of openings 1002, are disposed on the uppermost channel layer 208, and can extend over dielectric fins 904. Dummy gate structures 1102 extend lengthwise in a direction that is different than (e.g., orthogonal to) the lengthwise direction of fin structures 212. For example, dummy gate structures 1102 extend substantially parallel to one another along the x-direction, having a length defined in the x-direction, a width defined in the y-direction, and a height defined in the z-direction. Dummy gate structures 1102 are disposed over channel regions of the fins 212 of the multigate device 200 and between source/drain regions (S/D) of the fin structures 212 of the multigate device 200. Each dummy gate structure 1102 may extend over one or a plurality of fin structures 212.

Figure 11:
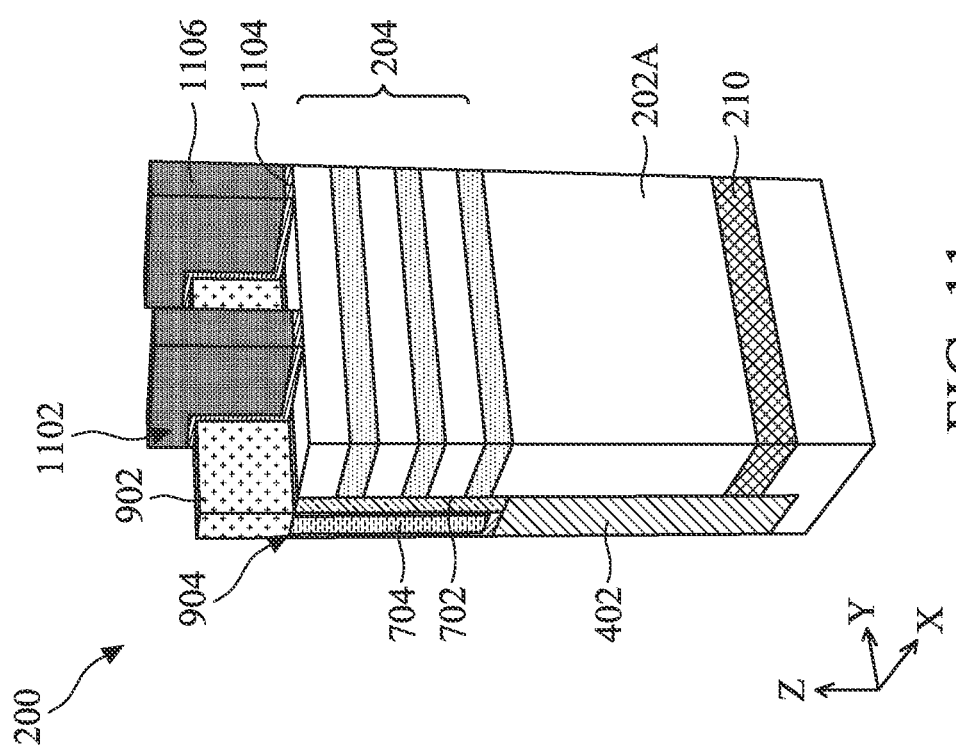

Each dummy gate structure 1102 includes a dummy gate dielectric 1104 and a dummy gate electrode 1106. Dummy gate dielectric 1104 includes a dielectric material, such as silicon oxide, a high-k dielectric material, other suitable dielectric material, or combinations thereof. In some embodiments, dummy gate dielectric 1104 includes an interfacial layer (including, for example, silicon oxide) and a high-k dielectric layer disposed over the interfacial layer. Dummy gate electrode 1106 includes a suitable dummy gate material, such as polysilicon. In some embodiments, dummy gate structures 1102 include numerous other layers, for example, hard mask layers, capping layers, interface layers, diffusion layers, barrier layers, or combinations thereof. In one implementation, the hard mask layer includes a silicon oxide layer and a silicon nitride layer. Dummy gate structures 1102 are formed by deposition processes, lithography processes, etching processes, other suitable processes, or combinations thereof. For example, a first deposition process is performed to form a dummy gate dielectric layer over multigate device 200 and a second deposition process is performed to form a dummy gate electrode layer over the dummy gate dielectric layer. The deposition processes include CVD, PVD, ALD, HDPCVD, MOCVD, RPCVD, PECVD, LPCVD, ALCVD, APCVD, plating, other suitable methods, or combinations thereof. A lithography patterning and etching process is then performed to pattern the hard mask layer, the dummy gate electrode layer, and the dummy gate dielectric layer to form dummy gate structures 1102, which include dummy gate dielectric 1104 and dummy gate electrode 1106 as depicted in FIG. 11. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Figure 12:
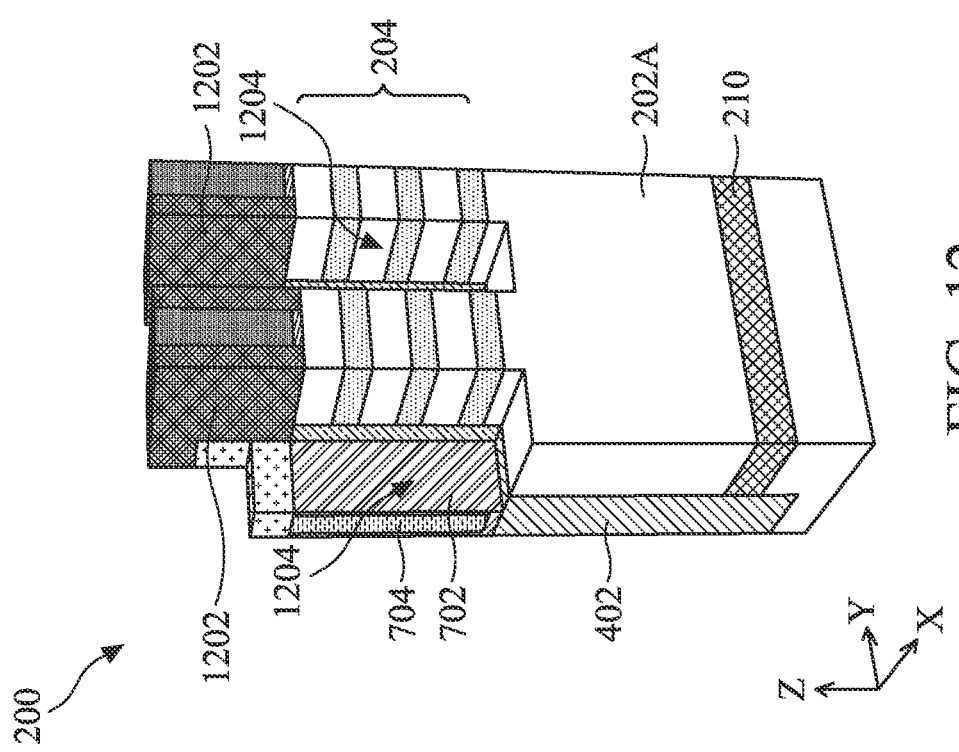

The dummy gate structures 1102 may further include gate spacers 1202 disposed on the sidewalls. Referring to the example of FIG. 12, gate spacers 1202 are formed along sidewalls of dummy gate stacks 1102. The gate spacers 1202 may be comprised of suitable dielectric material. The dielectric material can include silicon, oxygen, carbon, nitrogen, other suitable material, or combinations thereof (e.g., silicon oxide, silicon nitride, silicon oxynitride, silicon carbide, silicon carbon nitride, silicon oxycarbide, and/or silicon oxycarbonitride). In some embodiments, gate spacers 1202 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate structures 1102.

The method 100 then proceeds to block 112 where the source/drain regions of the fin structure(s) are recessed to prepare for source/drain feature formation. Referring to the example of FIG. 12, portions of fin structures 212 in source/drain regions of multigate device 200 (i.e., source/drain regions of fin structures 212 that are not covered by gate structures 1102) are at least partially removed or recessed to form source/drain recesses or trenches 1204. In the depicted embodiment, an etching process completely removes semiconductor layer stacks 204 in source/drain regions of multigate device 200, thereby exposing fin portions 202A in source/drain regions. In embodiments, the etching process also completely removes portions of cladding layer 602 abutting the source/drain regions of the fin structures 212. In the depicted embodiment, each source/drain recess 1204 thus has a sidewall defined by a respective one of dielectric fins 904 and a bottom defined by a respective fin portion 202A and respective isolation feature 402. The etching process can include a dry etching process, a wet etching process, other suitable etching process, or combinations thereof. In some embodiments, the etching process is a multi-step etch process. In some embodiments, the recessing removes a top portion of the dielectric fin 904 (e.g., a portion of a dielectric layer 902).

Figure 13:
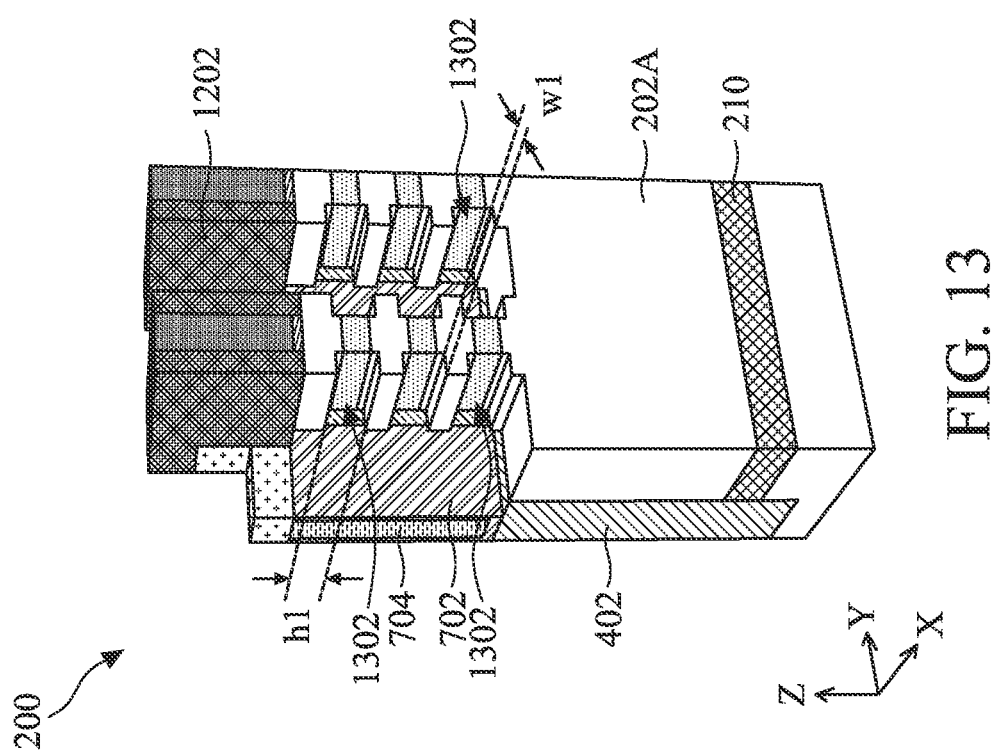
Figure 14:
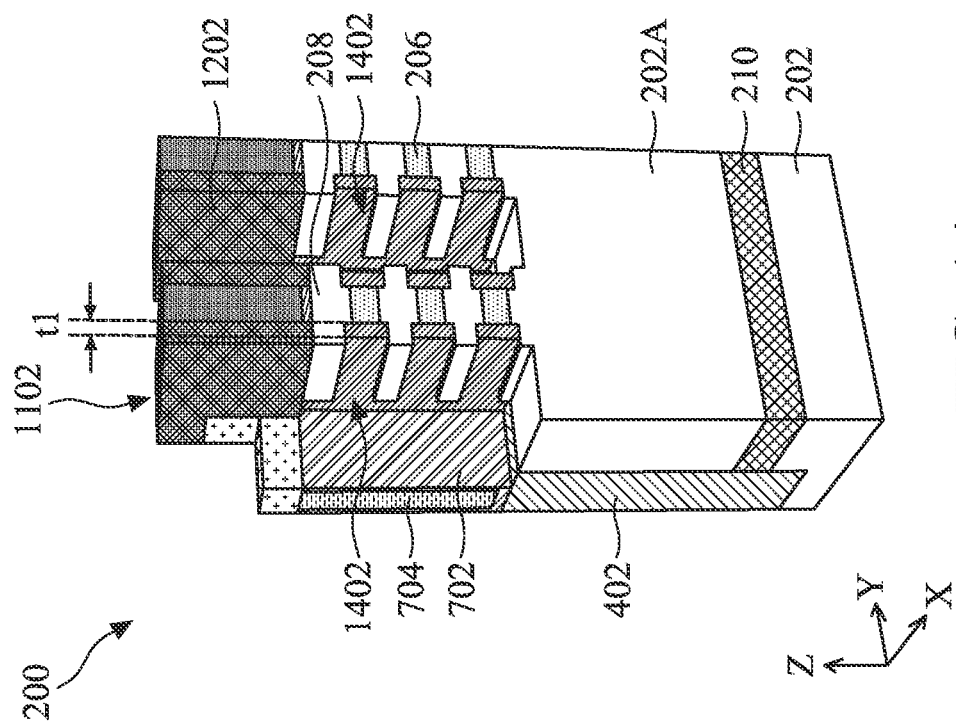
Figure 15:
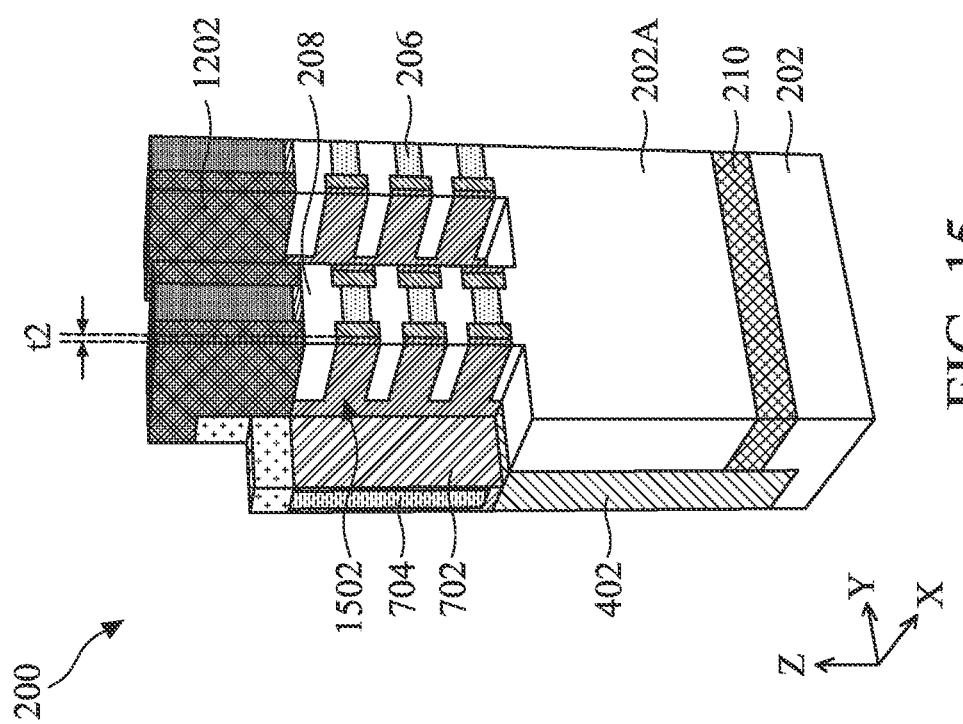

The method 100 then proceeds to block 114 where inner spacers are provided between the respective source/drain region and gate structure. FIGS. 13, 14, and 15 illustrate the exemplary steps of forming inner spacers having a plurality of layers. Referring first to FIG. 13, in some embodiments, block 114 includes slightly (laterally) etching sacrificial layers 206 to form recesses 1302 (e.g., vertically under the gate structure 1102 and including gate spacers 1202). The recesses 1302 are formed between suspended end regions of the channel layers 208. In an embodiment, the recesses 1302 are formed by selective etching of the silicon germanium (SiGe). In some embodiments, the channel layers 208 are slightly etched reducing their thickness at the recesses 1302. In an embodiment, the recesses 1302 include a height h1 of between approximately 5 nanometers (nm) and approximately 15 nm. In an embodiment, the recesses 1302 have an inner edge (e.g., nearest channel) that is substantially aligned with an inner edge (e.g., nearest gate) of the gate spacers 1202. In an embodiment, the recesses 1302 have a width w1 between approximately 2 nm and approximately 15 nanometers. The width and height of the recesses 1302 can define dimensions of the subsequently formed air gap as discussed below, selecting the thickness t1 and width w1 impacts the device performance in terms of capacitance and impacts the device fabrication. It is noted that in some embodiments, the recesses 1302 extend to the dielectric fin 904. The cladding layer 602 may be etched simultaneously with the sacrificial layers 206 creating a portion of the recess 1302 between the termination of the channel layer 208 and the dielectric fin 904.

Continuing with the formation of the inner spacers, and referring to the example of FIG. 14, a first inner spacer 1402 is formed in each of the recesses 1302. In an embodiment, the first inner spacer 1402 is a dielectric material. Exemplary materials for the first inner spacer 1402 include nitride (e.g., SiN, SiON). In another embodiment, the first inner spacer 1402 includes another material type that allows for selectivity to the surrounding materials. In an embodiment, the first inner spacer 1402 may be referred to as a dummy spacer or dummy dielectric material as it is a sacrificial material subsequently removed to form the air gap features, or portions thereof, as discussed below. The first inner spacer 1402 extends between adjacent suspended regions of the channel layers 208 and between a lowest channel layer 208 and the portion 202A. The first inner spacer 1402 also extends between an end of the channel layers and the dielectric fin 904.

In an embodiment, the thickness t1 of the second inner spacer is between approximately 1 nanometer (nm) to approximately 10 nm. The thickness t1 may be less than the width w1 of the recess 1302. In some implementations, dielectric material is deposited over the device 200 (e.g. conformally) and subsequently etched back to provide the first inner spacer 1402 contained within the recesses 1302. Each of the first inner spacers 1402 expand the height h1 of the recess 1302. In some embodiments, the thickness t1 of the inner spacer is selected to determine the air gap dimensions. If the thickness t1 is too large, the air gap may allow subsequently deposited layers (see block 130) to enter the air gap. If the thickness t1 is too thin, the air gap provided is such that the performance of the device is not sufficiently improved by the resultant air gap as discussed below.

The first inner spacer interfaces the stack 204 including the sacrificial layers 206; the first inner spacer can interface the extent of the sidewall of the sacrificial layer 206. Due to the slight etching of the channel layers 208 in forming the recesses 1302, in some implementations, a small area of the sidewall of the channel layer 208 may be interfaced, in addition to interfacing the top and bottom surfaces of the channel layers 208. In other embodiments, the etching of the recesses 1302 does not impact the channel layer 208 and the first inner spacer layer 1402 interfaces only a top and/or bottom surface of the channel layers 208. The first inner spacer layer 1402 also interfaces the dielectric fin 904 as discussed above. Similarly, the first spacer layer can interface a portion (e.g., bottom surface) of the gate spacer 1202 and a portion (e.g., top surface) of the isolation feature 402 where the cladding layer has been previously removed.

Continuing with the formation of inner spacers and referring to the example of FIG. 15, a second inner spacer 1502 is formed abutting the first inner spacer 1402 in each recess 1302. In an embodiment, the second inner spacer 1502 is a low-k material. Exemplary materials for the second inner spacer 1502 include, but are not limited to, SiOC, SiCN, SiOCN, or combinations thereof.

In some implementations, low-k material of the second inner spacer 1502 is deposited over the device 200 and subsequently etched back to provide the second inner spacer 1502 contained within the recesses 1302. Deposition processes for the material of the second inner spacer include CVD, PVD, ALD, HDPCVD, MOCVD, RPCVD, PECVD, LPCVD, ALCVD, APCVD, and/or other suitable methods. In some embodiments, the thickness t2 of the second inner spacer 1502 is less than the thickness t1 of the first inner spacer 1402. The thicknesses t1, t2 affect the dielectric constant of the region between the source/drain feature and the later formed metal gate and thus, affect the capacitance of the device as discussed below.

In an embodiment, the thickness of the second inner spacer t2 is approximately 1 nanometer (nm) to approximately 5 nm. The thickness t2 may be less than the width w1 of the recess 1302. In some embodiments, t1 plus t2 is substantially equal to the width w1 of the recess 1302. Each of the second inner spacers 1502 expand the height h1 of the recess 1302. Thus, in some embodiments, the height of the second inner spacers 1502 is between approximately 5 and 15 nm. In some implementations, such as those of device 200', the thickness of the second inner spacers t2 is selected to define a portion of the air gap inner spacer dimensions. In some implementations, the thickness of the second inner spacers t2 is controlled such that it is not too great, which can cause an increase in capacitance of the device (e.g., decreasing the dimensions of an air gap). In some implementations, the thickness of the device of the second inner spacers t2 is selected such that it is sufficient to protect the source/drain feature during the removal of the first inner spacer 1402 to form the air gap, as discussed below.

The second inner spacer 1502 interfaces the first inner spacer 1402 and a top/bottom surface of the channel layers 208. The second inner spacer layer 1502 also interfaces the dielectric fin 904, and in particular, the first dielectric layer 702. In some implementations, this interface is at the region where the cladding layer 206 has been removed. In an embodiment, the first dielectric layer 702 may be the same composition as the second inner spacer layer 1502. The second spacer layer can also interface a portion (e.g., bottom surface) of the gate spacer 1202 and a portion (e.g., top surface) of the isolation feature 402 where the cladding layer has been previously removed. The second inner spacer 1502 also interfaces the source/drain region and, when formed, the source/drain feature.

In some implementations, the inner spacers 1402/1502 are slightly recessed along the y-direction relative to semiconductor layers 208, such that spacers 1402/1502 do not cover an entirety of top surfaces and/or bottom surfaces of semiconductor layers 208 and a semiconductor layer 208 can be seen extending from above/below the inner spacers 1402/1502. In other words, the recess 1302 may not be entirely filled in some implementations. In some embodiments, inner spacers 1402/1502 cover an entirety of top surfaces and/or bottom surfaces of semiconductor layers 208. In other words, in some implementations, an outer surface of the second inner spacer 1502 is vertically aligned with an outer edge of the channel layer 208.

Figure 16:
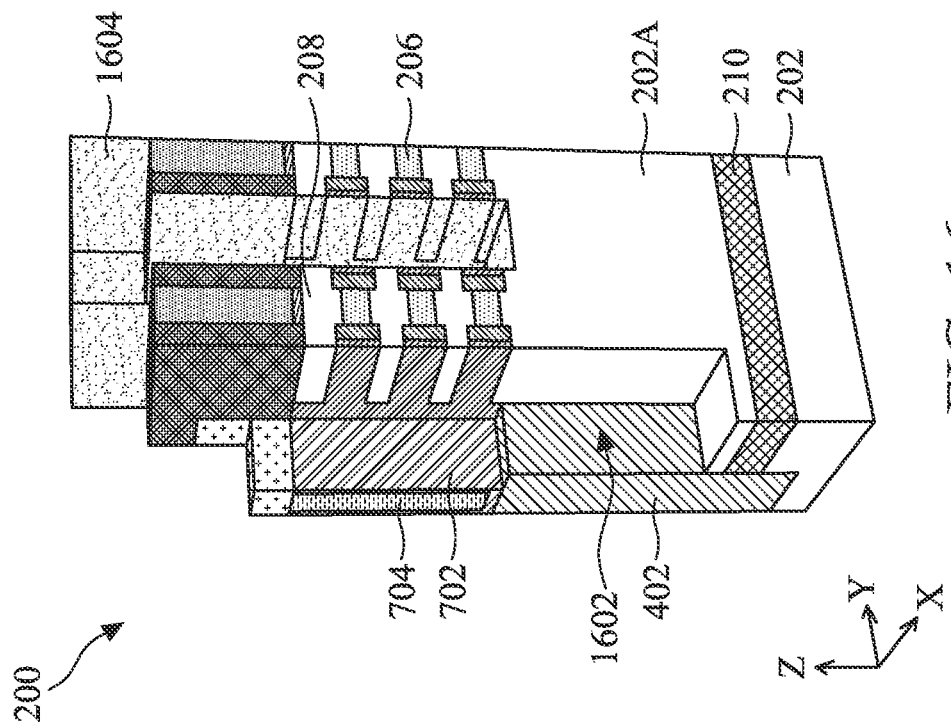

The method 100 then proceeds to block 116 where an etch at one terminal of the GAA transistor(s) of the device is performed. In some implementations, one of the source or drain sides of the device is further etched. In an embodiment, an etch of the substrate under the source-side of the device(s) is performed. The etch may be provided at a terminal (e.g., source/drain) where a backside contact is to be made, as discussed in further detail below. Referring to the example of FIG. 16, a source-side recess 1602 is etched in the source/drain region of the device 200 and in particular, the fin 212. The source-side recess 1602 is contiguous with the recess 1204. In some implementations, to form the recess 1602, a masking element 1604 is disposed over the device 200 providing an opening over the source side of the etched back fin structure 212. Within the opening, an etch process extends the depth of the recess 1204 at one of the source or drain side. The recess 1602 may be selectively etched by a suitable wet or dry etching process that is suitable for etching the composition of the substrate 202 (e.g., silicon), while minimizing or avoiding etching of adjacent dielectric materials including second inner spacers 1502, dielectric fin 904, and isolation feature 402. The source-side recess 1602 may terminate above the buried etch stop layer 210.

Figure 17:
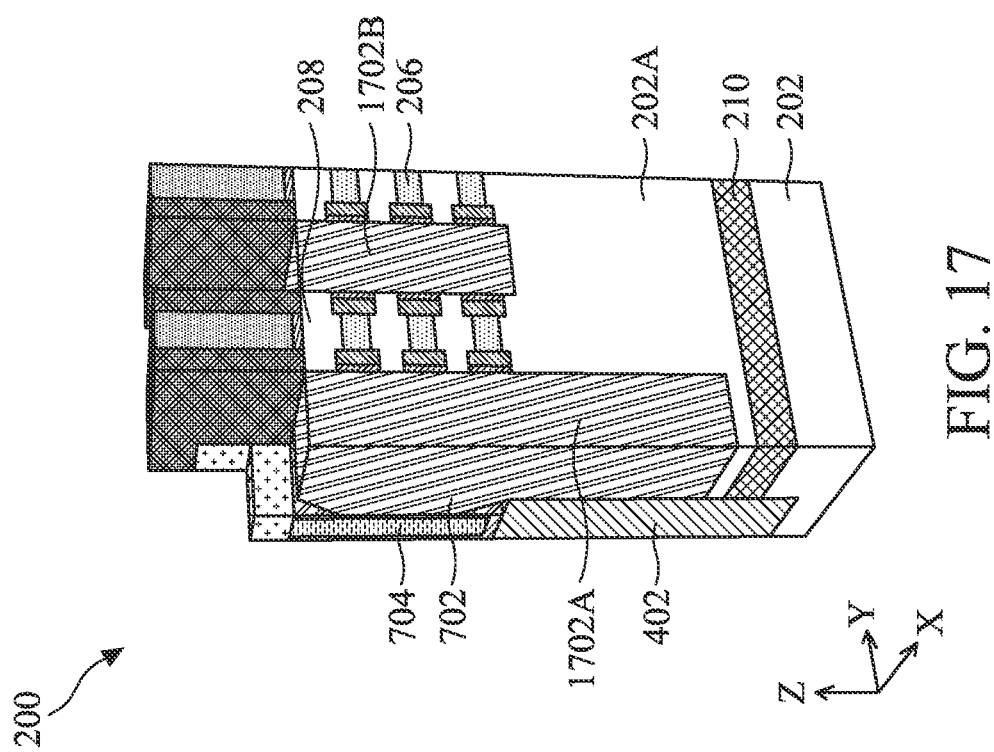

The method 100 then proceeds to block 118 where source/drain features are grown for the device. Referring to the example of FIG. 17, source/drain features 1702 are formed. The source/drain features are labeled a source feature 1702A and a drain feature 1702B, however, other configurations are possible. The source feature 1702A and drain feature 1702B are referred together as source/drain features 1702. In an embodiment, the source feature 1702A and the drain feature 1702B are of the same type (e.g., NFET, PFET). To form the source/drain features 1702, a semiconductor material is epitaxially grown from exposed seed areas (e.g., fin portions 202A of substrate 202) within the recesses 1204 and 1602. In some implementations, the semiconductor layers 208 exposed by source/drain recesses 1204 are also seed areas for the epitaxial material, though the growth rate may vary from the top surface of the fin portions 202A. In some embodiments, epitaxial source/drain features 1702 completely the respective fill source/drain recesses, such that top surfaces of epitaxial source/drain features 1702 are substantially planar with a bottom of the gate structure 1102. An epitaxy process can use CVD deposition techniques (for example, LPCVD, VPE, and/or UHV-CVD), molecular beam epitaxy, other suitable epitaxial growth processes, or combinations thereof. The epitaxy process can use gaseous and/or liquid precursors, which interact with the composition of fin portions 202A and/or semiconductor layers 208. Epitaxial source/drain features 1702 are doped with n-type dopants and/or p-type dopants. In some embodiments, for n-type transistors, epitaxial source/drain features 1702 include silicon, which can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial source/drain features 1702A/B include silicon germanium or germanium, which can be doped with boron, other p-type dopant, or combinations thereof (for example, forming Si:Ge:B epitaxial source/drain features). In some embodiments, epitaxial source/drain features 1702 include more than one epitaxial semiconductor layer, where the epitaxial semiconductor layers can include the same or different materials and/or dopant concentrations. In some embodiments, epitaxial source/drain features 1702 include materials and/or dopants that achieve desired tensile stress and/or compressive stress in respective channel regions of the n-type transistors and/or the p-type transistors. In some embodiments, epitaxial source/drain features 1702 are doped during deposition by adding impurities to a source material of the epitaxy process (i.e., in-situ). In some embodiments, epitaxial source/drain features 1702 are doped by an ion implantation process subsequent to a deposition process. In some embodiments, annealing processes (e.g., rapid thermal annealing and/or laser annealing) are performed to activate dopants in epitaxial source/drain features 1702 and/or other source/drain regions (for example, heavily doped source/drain regions and/or lightly doped source/drain (LDD) regions). In some embodiments, certain ones of epitaxial source/drain features 1702 of the device 200 are formed in separate processing sequences that include, for example, one transistor region when forming epitaxial source/drain features 1702 in another transistor region.

It is noted that due to there being no significant growth of the epitaxial material of source/drain features 1702, a gap may be formed adjacent an exposed top surface of the isolation structure 402. In some implementations, this gap may interface the second inner spacer 1502 (e.g., adjacent the bottom channel region of the device).

Figure 18:
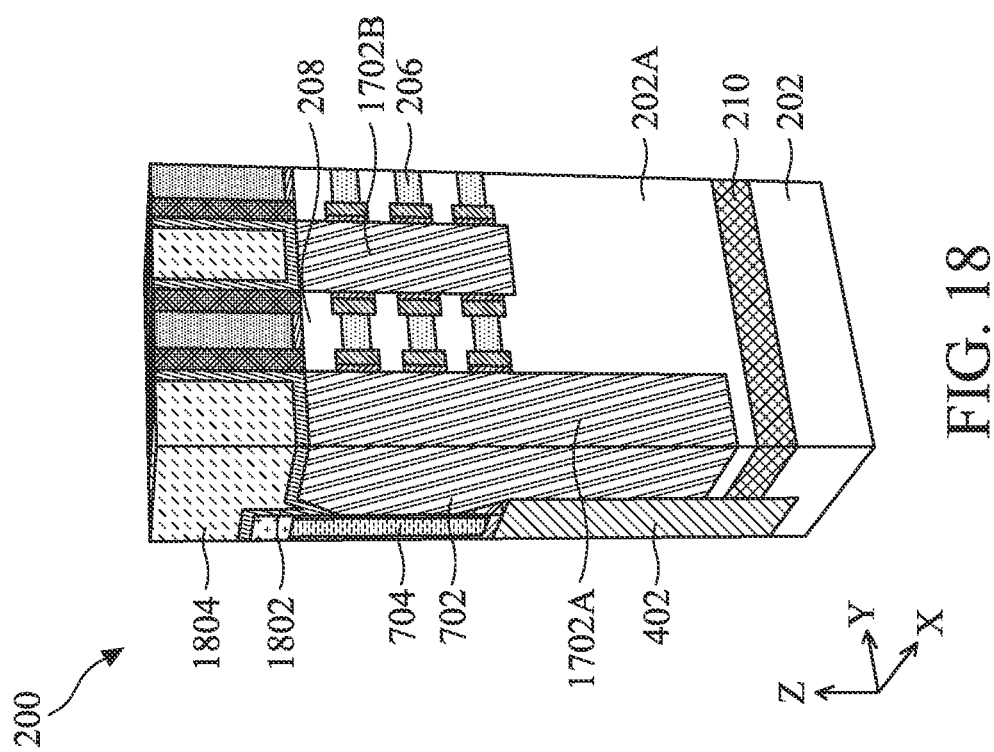

In some implementations, following the formation of the source/drain epitaxial features, insulating layers are formed thereover. Referring to the example of FIG. 18, deposition processes (such as CVD, PVD, ALD, HDPCVD, MOCVD, RPCVD, PECVD, LPCVD, ALCVD, APCVD, other suitable methods, or combinations thereof) are performed to form a bottom contact etch stop layer (B-CESL) 1802 and an inter-level dielectric (ILD) layer 1804 over multigate device 200. A CMP process and/or other planarization process is performed until reaching (exposing) top portions (or top surfaces) of dummy gate stacks 1102. In some embodiments, ILD layer 1804 is formed by FCVD, HARP, HDP, or combinations thereof. In some embodiments, the planarization process removes hard mask layer(s) of dummy gate structure 1102 to expose underlying dummy gate electrodes 1106 of dummy gate structure 1102, such as polysilicon gate electrodes. The B-CESL 1802 and/or ILD layer 1804 are disposed over epitaxial source/drain features 1702 and dielectric fins 904 adjacent the source/drain regions of multigate device 200. ILD layer 1804 is further disposed between adjacent gate structures 1102. ILD layer 1804 includes a dielectric material including, for example, silicon oxide, carbon doped silicon oxide, silicon nitride, silicon oxynitride, TEOS-formed oxide, PSG, BSG, BPSG, FSG, Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other suitable dielectric material, or combinations thereof. In some embodiments, ILD layer 1804 includes a dielectric material having a dielectric constant that is less than a dielectric constant of silicon dioxide (e.g., k<3.9). In some embodiments, ILD layer 1804 includes a dielectric material having a dielectric constant that is less than about 2.5 (i.e., an extreme low-k (ELK) dielectric material), such as SiO2 (for example, porous silicon dioxide), silicon carbide (SiC), and/or carbon-doped oxide (for example, a SiCOH-based material (having, for example, Si—CH3 bonds)), each of which is tuned/configured to exhibit a dielectric constant less than about 2.5. ILD layer 1804 can include a multilayer structure having multiple dielectric materials. In some embodiments, The B-CESL 1802 is disposed between ILD layer 1804 and epitaxial source/drain features 1702, dielectric layers 902 (of dielectric fins 904), and gate spacers 1202. CESL 1802 includes a material different than ILD layer 1804, such as a dielectric material that is different than the dielectric material of ILD layer 1804. For example, where ILD layer 1804 includes a dielectric material that includes silicon and oxygen and having a dielectric constant that is less than about the dielectric constant of silicon dioxide, CESL 1802 can include silicon and nitrogen, such as silicon nitride or silicon oxynitride.

In an embodiment, CESL 1802 is disposed on and physically contacts epitaxial source/drain features 1702. ILD layer 1804 and CESL 1802 are a portion of a multilayer interconnect (MLI) feature formed thereover. In some embodiments, ILD layer 1804 and CESL 1802 form a bottommost layer of the MLI feature (e.g., ILD0). An MLI feature electrically couples various devices (for example, p-type transistors and/or n-type transistors of multigate device 200, resistors, capacitors, and/or inductors) and/or components (for example, gate electrodes and/or epitaxial source/drain features of p-type transistors and/or n-type transistors of multigate device 200), such that the various devices and/or components can operate as specified by design requirements of multigate device 200. An MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature. During operation, the interconnect features are configured to route signals between the devices and/or the components of multigate device 200 and/or distribute signals (for example, clock signals, voltage signals, and/or ground signals) to the devices and/or the components of multigate device 200. In an embodiment, a contact element extends through the CESL 1802 and ILD 1804 over the drain feature 1702B to provide electrical contact to the drain feature 1702B, see below. In an embodiment, the contact to the source feature 1702A is through backside contact as discussed below, and as such the CESL 1802 and ILD 1804 provide insulation of the source feature 1702.

Figure 19:
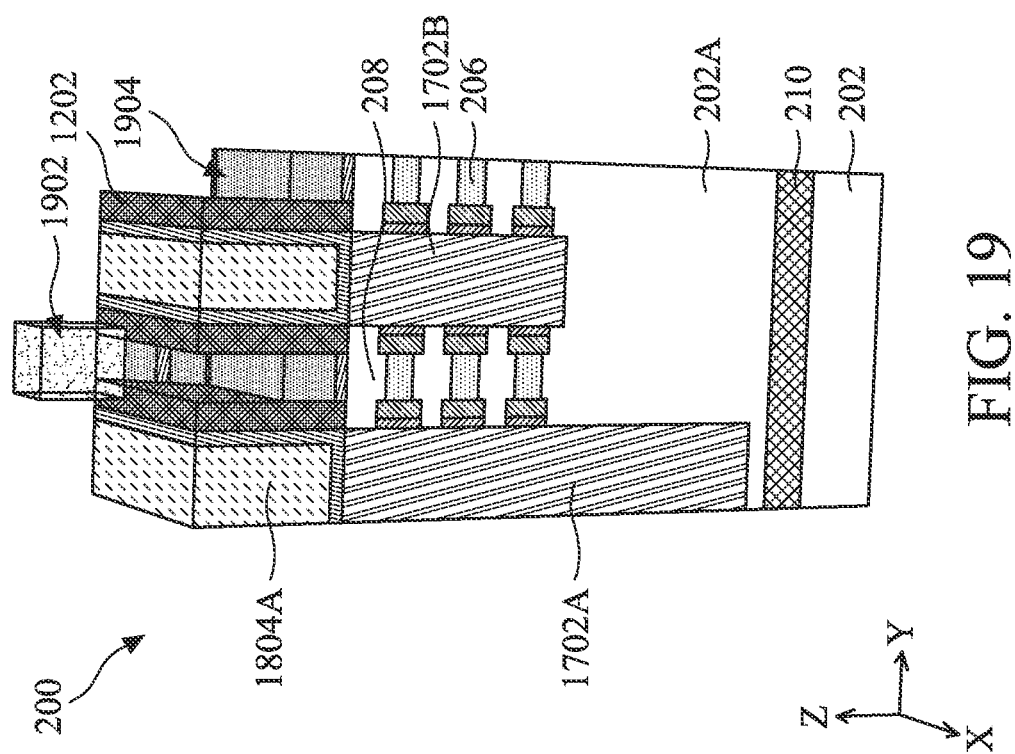

The method 100 then proceeds to block 120 where a replacement gate process is performed to replace the dummy gate structure of block 110 with a metal gate structure. In some implementations, block 120 also includes performing a cut metal gate process where certain areas are defined as providing gate separation features of the dielectric fins while certain other gate structures are defined as being interconnected with adjacent gates. In some implementations, for example, an etching process is performed that recesses dummy gate electrodes 1106 until dielectric layers 902 of dielectric fins 904 are exposed from between remaining portions of dummy gate electrodes 1106. See FIG. 19. The exposed dielectric layers 902 are then removed from that region of the dielectric fins 904, providing opening 1904, while a masking element 1902 protects other regions. Thus, dielectric fins 904 spanning certain device regions are maintained providing insulation between adjacent features (e.g., gate structures) thus providing a cut metal gate region, while portions of dielectric fins 904 spanning certain device regions are removed (in part) allowing the subsequently formed metal gate to be contiguous across the region. With respect to FIGS. 19, 20A, and 20B, the dielectric fin 904 is maintained under masking element 1902 thus providing a cut gate region while the dielectric fin 904 at the right of the figure is partially removed (e.g., dielectric layer 902 is recessed) forming opening 1904.

Figure 20B:
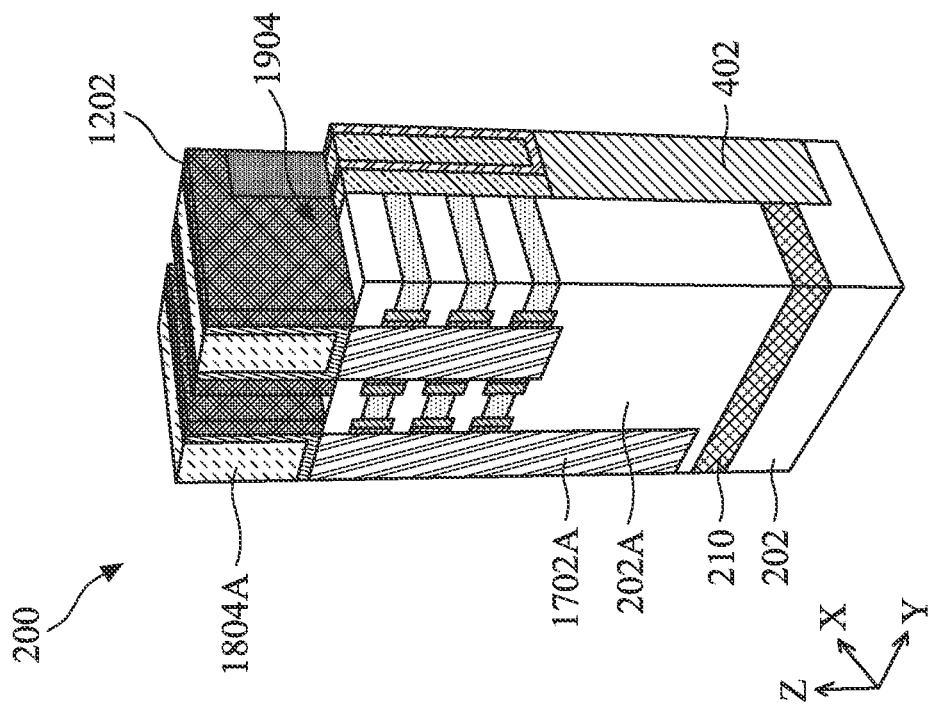
Figure 20A:
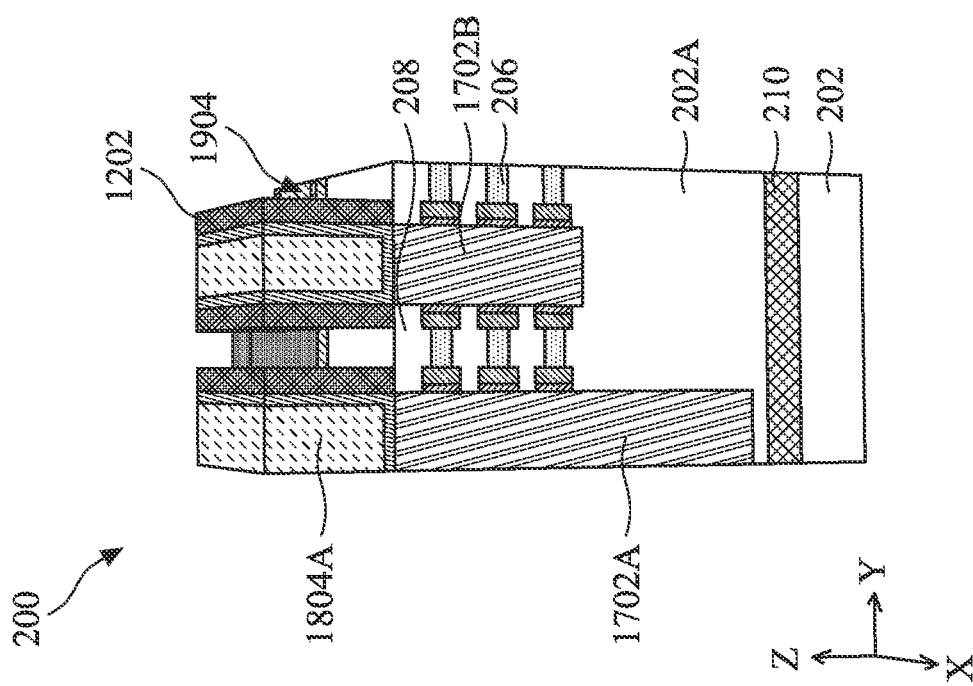

Continuing the replacement gate process and referring to the example of FIGS. 20A and 20B, a remainder of dummy gate structures 1102 is then removed. For example, an etching process completely removes dummy gate electrodes 1106 and dummy gate electrode 1104 to expose an upper channel layer 208. The etching process may be a selective dry etching process, wet etching process, or a combination thereof. The removal of the dummy gate structure forms a portion of the opening 2102 (e.g., that above the uppermost channel layer).

Figure 21B:
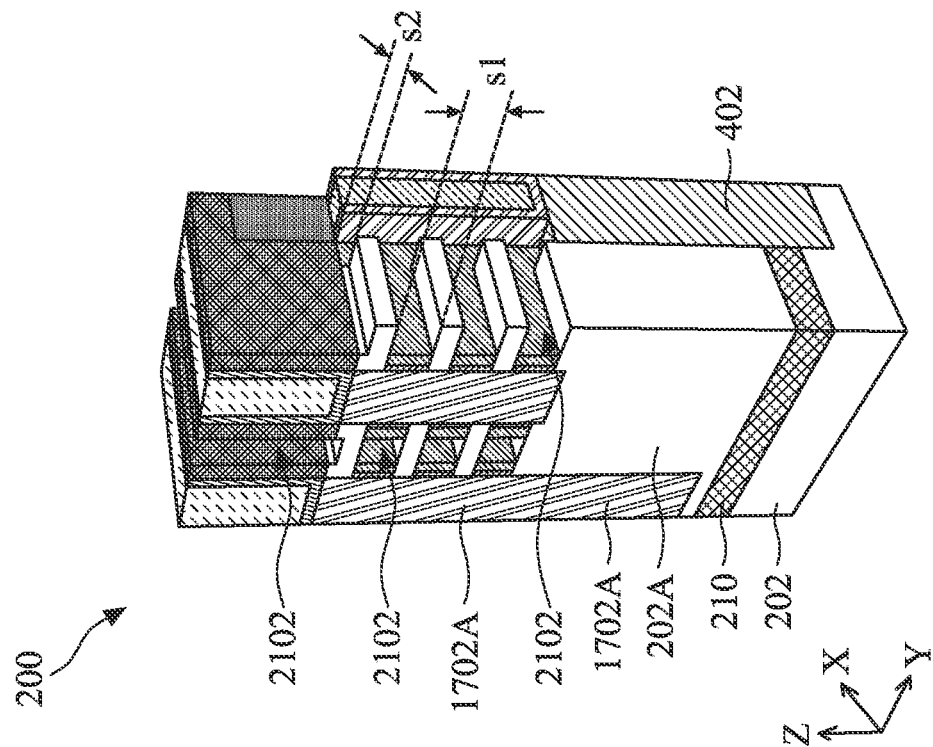
Figure 21A:
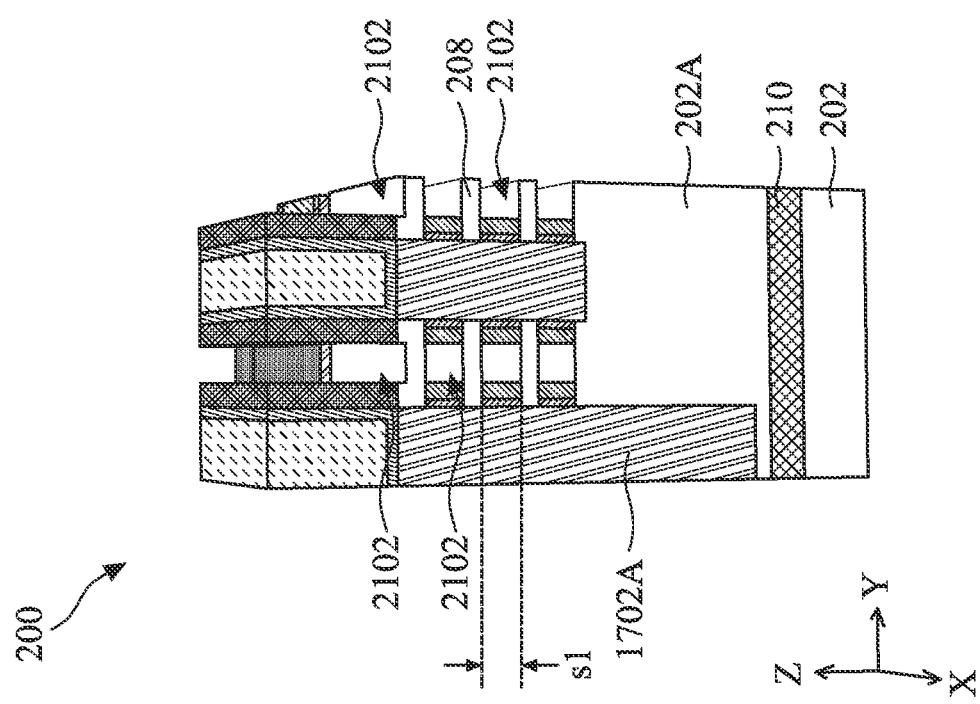

Continuing the replacement gate process and referring to the example of FIGS. 21A and 21B, a channel release process may be performed to result in the removal of the sacrificial layers 206 in the channel region, thereby forming suspended semiconductor layers 208 in the channel region, which are separated from one another and/or fin portions 202A by gaps. The etching process releasing the channel layers 208 may be a selective a dry etching process, a wet etching process, or a combination thereof. The channel release process may further include removing the cladding layer 602 in the channel region for example forming gap between an end of the channel layer 208 and the dielectric fin 904. The channel release process may include an etching process selective to a composition (e.g., silicon germanium) of the cladding layer 602 and/or the sacrificial layers 206, while providing no to minimal etching of the channel layers 208. The release of the channel layers, the dummy gate structure removal, and/or the cladding layer 602 removal provide respective openings 2102 in the channel regions of the device 200 as illustrated in FIGS. 21A and 21B. A spacing s1 is defined between channel layers 208 along the z-direction, and a spacing s2 is defined between channel layers 208 end and dielectric fins 904 along the x-direction. Spacing s1 may be between 5 and 15 nanometers (nm). In some embodiments, the spacing s1 may be substantially similar to the height h1. The spacing s1 may be provided such that sufficient spacing for formation of a gate structure of sufficient height for adequate performance is provided. If the spacing s1 is too large it may cause capacitance to increase for the device to a point of degrading performance. In some embodiments, spacing s2 is between approximately 5 and 20 nanometers (nm). If the spacing s2 is too large it may cause capacitance to increase for the device to a point of degrading performance. If the spacing s2 is too small, as discussed above, it may be insufficient to form the gate structure. In some embodiments, each channel layer 208 has nanometer-sized dimensions and can be referred to as "nanostructures," alone or collectively. In some embodiments, channel layers 208 have cylindrical-shaped profiles (e.g., nanowires), rectangular-shaped profiles (e.g., nanobars), sheet-shaped profiles (e.g., nanosheets (i.e., dimensions in the X-Y plane are greater than dimensions in the X-Z plane and the Y-Z plane to form sheet-like structures), or any other suitable shaped profile.

In some embodiments, the etching process to release the channel layers 208 partially, but minimally, etches channel layers 208, fin portions 202A, and/or isolation features 402. In some implementations, the etching process is sufficiently selective such that the channel layers 208, fin portions 202A, and/or isolation region 402 are minimally or not etched.

Figures 22A, 22B:
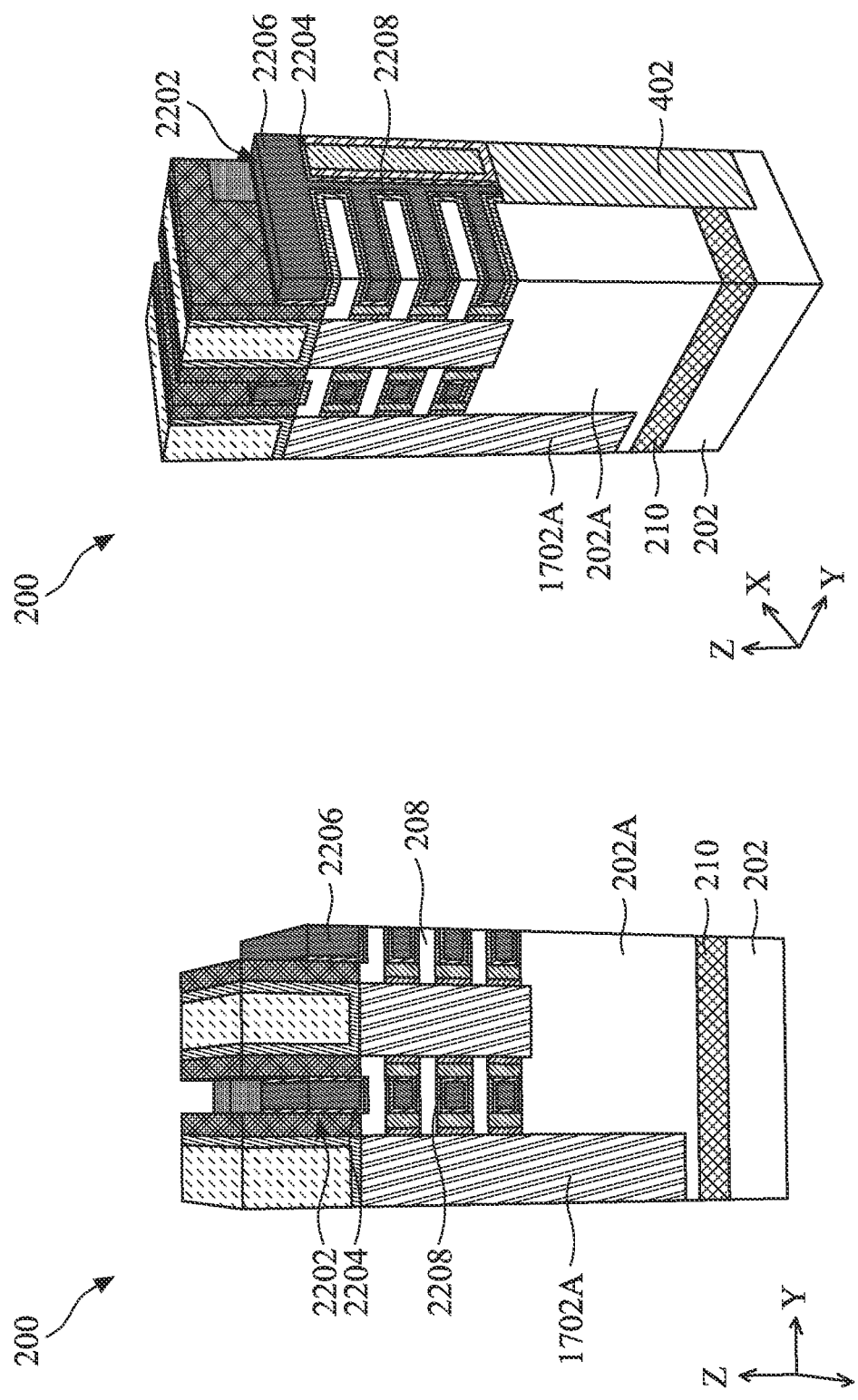

Block 120 of the method 100 then proceeds to fill the formed openings 2102 by the removal of the dummy gate structure and the release of the channel layers with a metal gate structure. The metal gate structure may be the functional gate(s) of the GAA device of the device 200. Referring to FIGS. 22A and 22B, metal gate structures 2202 (also referred to as metal gates and/or high-k/metal gates) are formed in gate openings 2102. Metal gate structures 2202 are configured to achieve desired functionality according to design requirements of multigate device 200. Metal gate structures 2202 each include a gate dielectric 2204 (for example, a high-k gate dielectric layer) and a gate electrode 2206 (for example, a work function layer and a bulk conductive layer). Metal gate structures 2202 may include numerous other layers, such as capping layers, interface layers, diffusion layers, barrier layers, hard mask layers, or combinations thereof. In some embodiments, forming metal gate structures 2202 includes depositing a gate dielectric layer over multigate device 200, where the gate dielectric layer partially fills gate openings 2102, depositing a gate electrode layer over the gate electrode layer, where the gate electrode layer fills a remainder of gate openings 2102, and performing a planarization process to remove excess gate materials from multigate 200. Gate dielectrics 2204 include a high-k dielectric layer, which includes a high-k dielectric material, which for purposes of metal gate structure 2202 refers to a dielectric material having a dielectric constant that is greater than that of silicon dioxide (k≈3.9). For example, the high-k dielectric layer includes $HfO_2$, HfSiO, $HfSiO_4$, HfSiON, HfLaO, HfTaO, HfTiO, HfZrO, HfAlOx, ZrO, $ZrO_2$, $ZrSiO_2$, AlO, AlSiO, $Al_2O_3$, TiO, $TiO_2$, LaO, LaSiO, Ta2O3, Ta2O5, Y2O3, SrTiO3, BaZrO, BaTiO3 (BTO), (Ba,Sr)TiO3 (BST), Si3N4, hafnium dioxide-alumina (HfO2-Al2O3) alloy, other suitable high-k dielectric material for metal gate stacks, or combinations thereof. The high-k dielectric layer is formed by any of the processes described herein, such as ALD, CVD, PVD, oxidation-based deposition process, other suitable process, or combinations thereof. In some embodiments, the gate structure 2202 includes an interfacial layer 2208 disposed between the high-k dielectric layer and channel layers 208. The interfacial layer 2208 includes a dielectric material, such as SiO2, HfSiO, SiON, other silicon-comprising dielectric material, other suitable dielectric material, or combinations thereof. The interfacial layer is formed by any of the processes described herein, such as thermal oxidation, chemical oxidation, ALD, CVD, other suitable process, or combinations thereof.

Gate electrodes 2206 are formed over gate dielectrics 2204/2208, filling a remainder of gate openings 2102. Gate electrodes 2206 includes a conductive material, such as polysilicon, aluminum, copper, titanium, tantalum, tungsten, molybdenum, cobalt, TaN, NiSi, CoSi, TiN, WN, TiAl, TiAlN, TaCN, TaC, TaSiN, other conductive material, or combinations thereof. In some embodiments, gate electrodes 2206 include a work function layer and a bulk conductive layer. The work function layer is a conductive layer tuned to have a desired work function (e.g., an n-type work function or a p-type work function), and the conductive bulk layer is a conductive layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, ZrSi2, MoSi2, TaSi2, NiSi2, WN, other suitable p-type work function materials, or combinations thereof. The bulk (or fill) conductive layer includes a suitable conductive material, such as Al, W, Ti, Ta, polysilicon, Cu, metal alloys, other suitable materials, or combinations thereof. Gate electrodes 2206 are formed by any of the processes described herein, such as ALD, CVD, PVD, plating, other suitable process, or combinations thereof.

After deposition of the materials of the metal gate structure 2202, in some implementations, the deposited materials are etched back such that portions of the dielectric fin 904 extend above the gate structure thereby providing a self-aligned metal gate cut process such as discussed above. The etch back process is a dry etching process, a wet etching process, other suitable etching process, or combinations thereof. After etchback, the dielectric fin 904 separates and isolates certain metal gates from other metal gates, as shown in the left gate of FIG. 22A. As illustrated there, after the etch back process, gate electrodes 2206 no longer extend uninterrupted from a first transistor region to a second transistor region (not shown). Further, after the etch back process, certain gate electrodes 2006 at the right of FIG. 22A and as visible in FIG. 22B, remain and extend over the previously etched back dielectric fins 904 (see metal gate 2202 and high-k dielectric 2204 interfacing top surfaces of dielectric layers 702, 704). As illustrated by the discussion of the method 100 above, the metal gate cut process is referred to as "self-aligned" because gate isolation structures (here, dielectric fins 904) are aligned between metal gates without having to perform a lithography process after forming metal gate stacks 2206. The self-aligned placement of the gate isolation structures (dielectric fins 904) provides electrical isolation between different devices, such as transistors, of multigate device 200.

Figure 23:
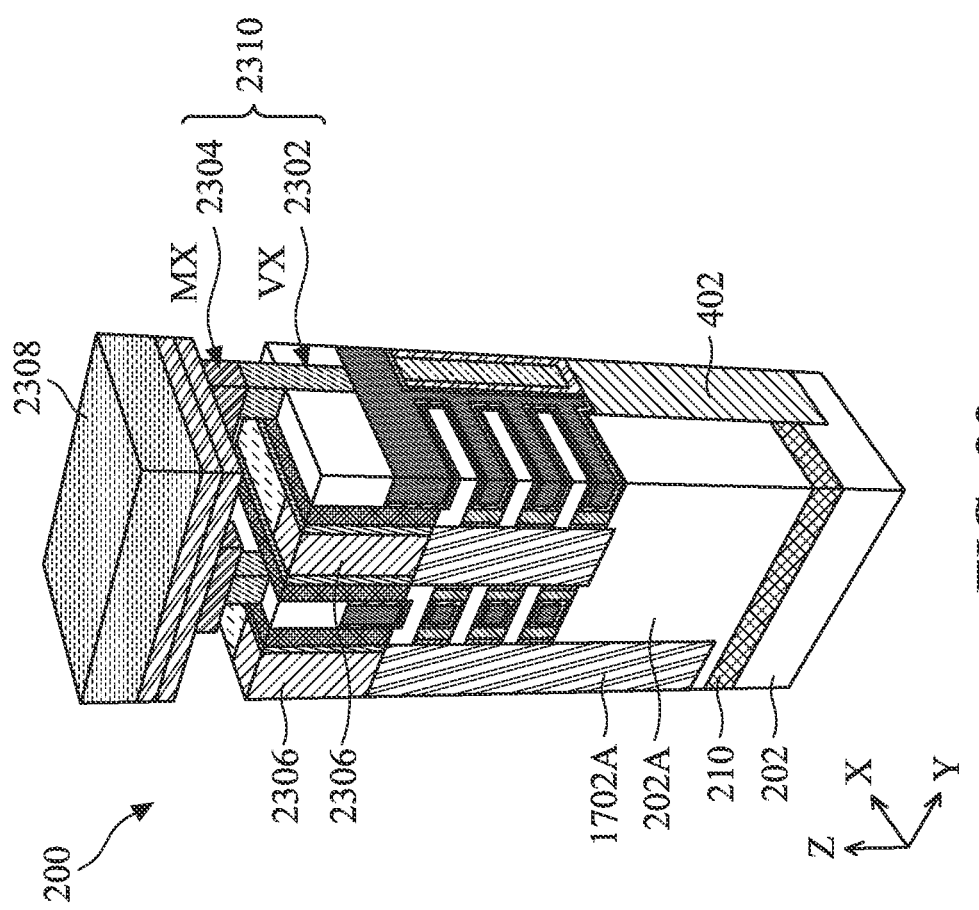

The method 100 then proceeds to block 122 where further fabrication over the front side of the device 200 is performed including forming remaining portions of a ML. The fabrication steps can include forming various contacts, such as gate contacts and certain source/drain contacts to facilitate operation of transistors of multigate device 200. Referring to the example of FIG. 23, gate contacts 2302 are formed to metal gates 2202. The gate contacts 2302 carry the electrical interconnection to a metallization layer 2304 (e.g., metal 0 or M0) which is part of a multi-layer interconnect (MLI) 2310 formed over the frontside of the device 200. Source/drain contacts 2306 may also be formed to epitaxial source/drain features 1702 A/B. In some embodiments, a source/drain contact 2306 to the source feature 1702A is not electrically connected to the MLI 2310 on the frontside of the device. In some embodiments, a source/drain contact 2306 to the drain feature 1702B is electrically connected to the MLI including metallization layers formed over the frontside of the device. Thereafter, the source/drain contacts and/or the gate contacts may with one or more electrically conductive materials, such as tungsten, ruthenium, cobalt, copper, aluminum, iridium, palladium, platinum, nickel, other low resistivity metal constituent, alloys thereof, or combinations thereof. The conductive material(s) can be deposited by PVD, CVD, ALD, electroplating, electroless plating, other suitable deposition process, or combinations thereof. The contacts may include a multi-layer structure such as a barrier layer, adhesion layer, bulk layer, and/or other suitable layers. Various dielectric layers interpose the contacts and the metallization layers such as ILD layers. A MLI electrically couples various devices (for example, p-type transistors and/or n-type transistors of multigate device 200, resistors, capacitors, and/or inductors) and/or components (for example, gate electrodes and/or epitaxial source/drain features of p-type transistors and/or n-type transistors), such that the various devices and/or components can operate as specified by design requirements of multigate device 200. An MLI feature typically includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI. During operation, the interconnect features are configured to route signals between the devices and/or the components of multigate device 200 and/or distribute signals (for example, clock signals, voltage signals, and/or ground signals) to the devices and/or the components of multigate device 200. The MLI 2310 is formed over the frontside of the device 200.

Figure 24:
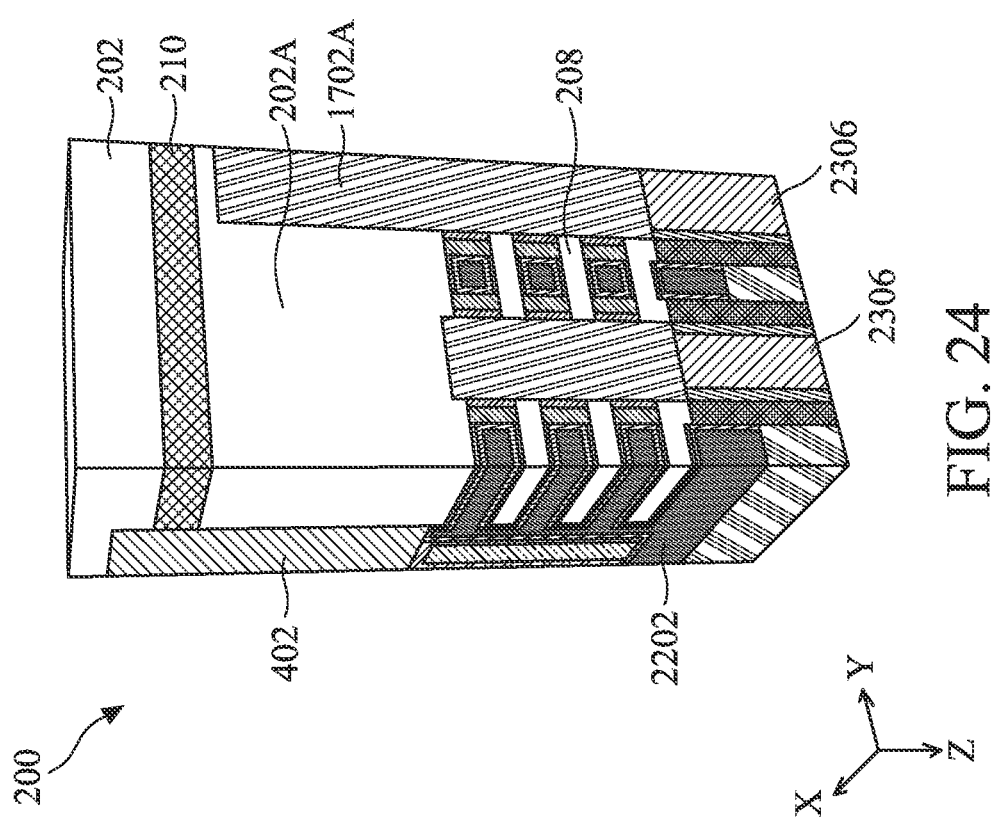

The method 100 then proceeds to block 124 where the device is flipped for backside proceeding. In some embodiments, a carrier wafer is attached to the frontside of the device, and the device flipped. Referring to the example of FIG. 23, a carrier wafer 2308 is attached to the frontside of the device over the ML. It is noted that the carrier wafer may be bonded to the device 200 by a releasable bonding material and may be maintained or removed for any of the following processing steps. FIGS. 24, like the figures that follow, illustrates the device 200 flipped with the backside at the "top" of the device.

Figure 25:
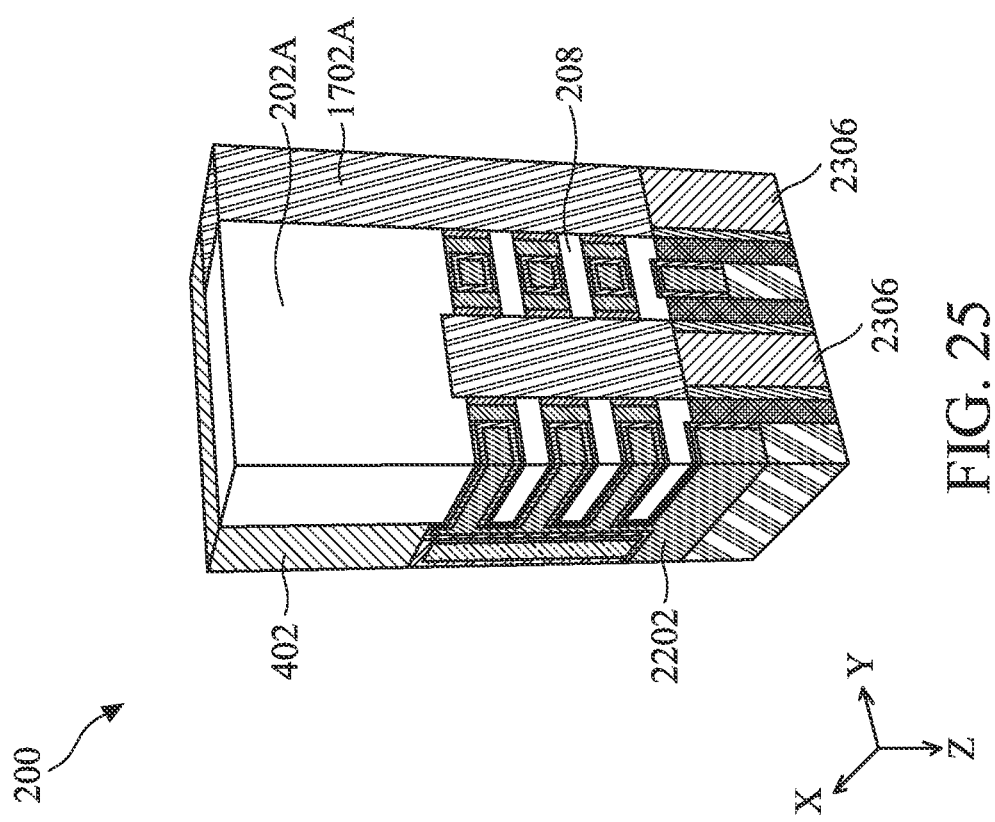

The method 100 then proceeds to block 126 where the structure is thinned by the removal of substrate material from the backside of the device. In some embodiments, the thinning is provided by attaching the frontside of the device 200 to a carrier, while the backside of the structure is thinned. Referring to the example of FIGS. 23, a carrier wafer 2308 is attached to the frontside of the device 200. Continuing the process and referring to FIG. 24, the device 200 is flipped for backside processing of thinning the device 200 by removing substrate 202 from the backside of the structure until the semiconductor fin portion 202A, adjacent isolation structure 402, and source feature 1702A are exposed from the backside of the device 200. The resulting thinned device is illustrated in FIG. 25. The thinning process may include a multi-step processing including, for example, a mechanical grinding process followed by a chemical thinning process.

Figures 26A, 26B:
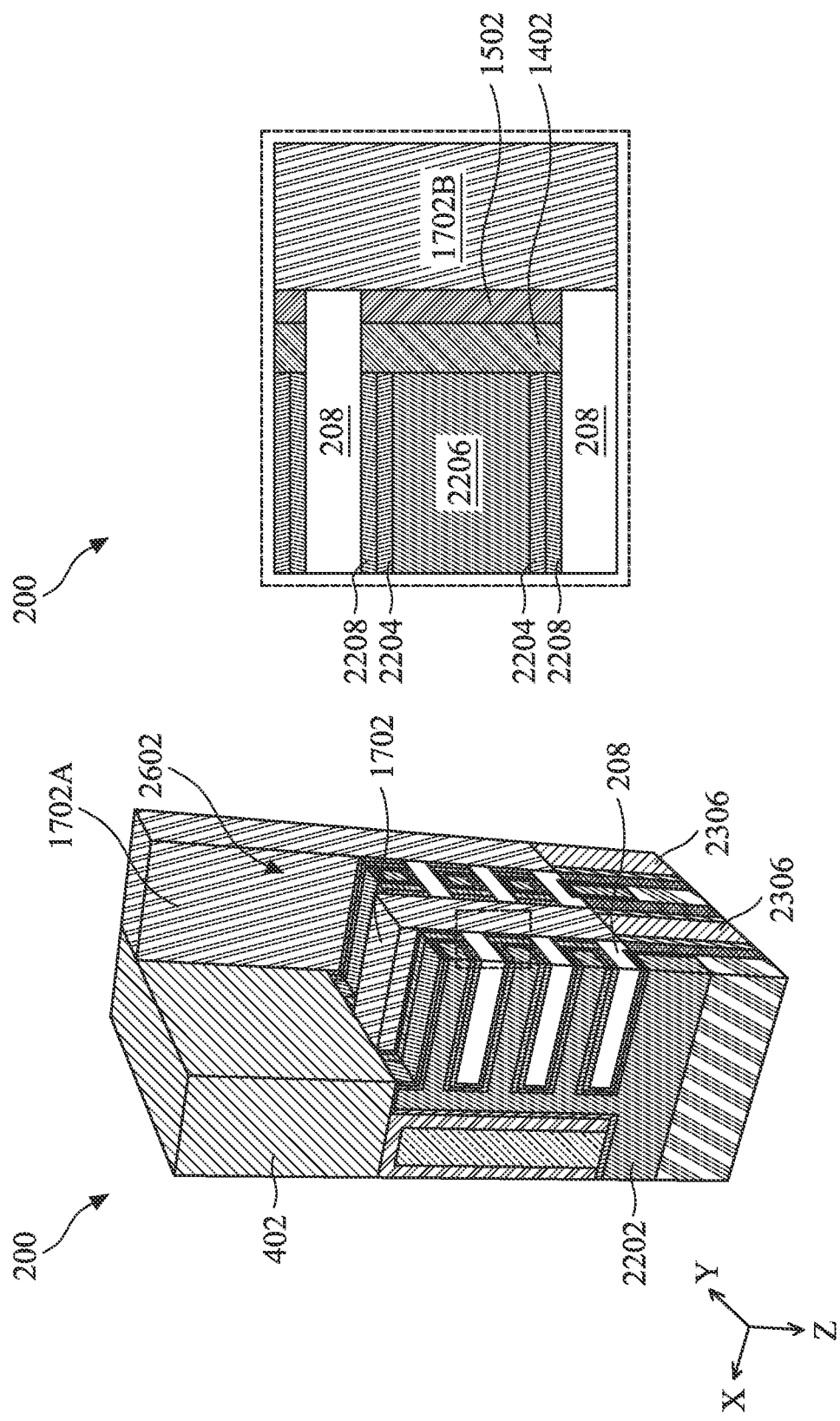

In some implementations, after thinning the device 200, block 126 of the method 100 continues to remove additional fin and substrate material to expose the features of the GAA from the backside. Referring to the example of FIG. 26A, portions of the fin 212 are removed forming opening 2602. The bottom of the opening exposes the first inner spacer 1402 and the second inner spacer 1502. The opening 2602 also exposes the adjacent metal gate structure 2202. In some embodiments, a dielectric layer such as the interfacial layer 2208 is exposed. The drain feature 1702B is also exposed, as well as a sidewall of the source feature 1702A. The removal of the silicon material may be a selective etching process such as a selective wet or dry etching targeting the fin 212 composition, for example, silicon, while leaving the source/drain features and dielectric compositions (e.g., interfacial layer 2208, gate dielectric 2204, isolation region 402, first inner spacer 1402, and second inner spacer 1502) substantially unetched. FIG. 26B is illustrative of a detailed cross-sectional view of a portion of the device 200 along the Y-axis.

Figures 27A, 27B:
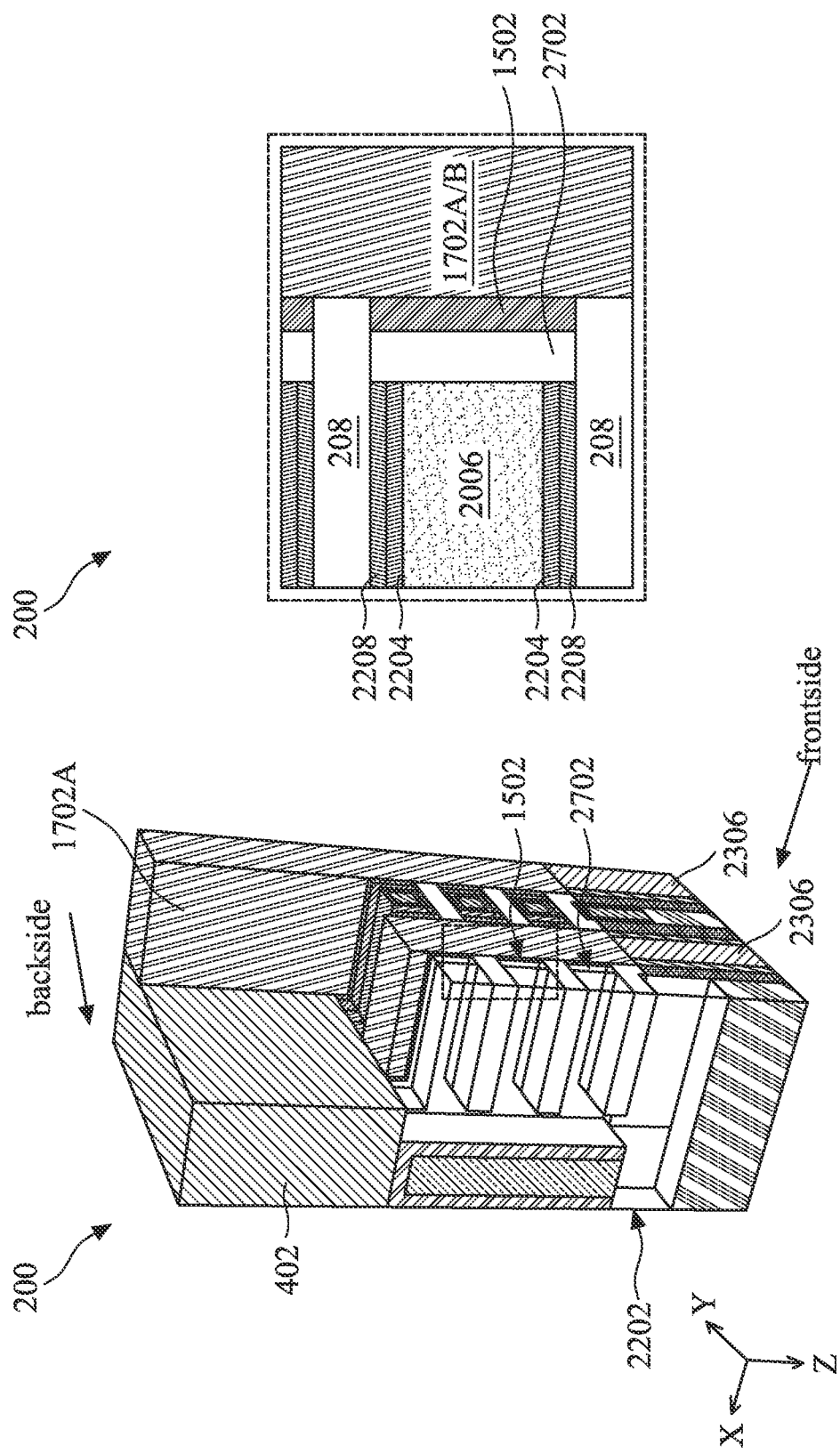

The method 100 then proceeds to block 128 where the inner spacer or portion thereof is removed to form an air gap. In an embodiment, the inner spacer or portion thereof is removed by a wet or dry etching process. The removal of the inner spacer may be performed by a selective etching process. In some embodiments, the etchant includes H3PO4, NaOH, combinations thereof, or other suitable etchant. For example, in some processes where the first inner spacer 1402 is a nitride, an etchant of at least one of H3PO4 or NaOH may be used to selectively etch the nitride with respect to the surrounding layers. It is noted that the inner spacer or portion thereof is removed from the backside of the device (e.g., opposite side from the gate structure). In other words, the etchant enters from the backside of the device. Referring to the example of FIGS. 27A and 27B, the first inner spacer 1402 has been selectively removed to form the openings or air gaps 2702. In some implementations, the first inner spacer 1402 is entirely removed. In a further embodiment, the second inner spacer 1502 is maintained on the device 200. The etchant may be selective to the material of the inner spacer 1402 and not substantially etch the second inner spacer 1502, the interfacial layer 2208 (if present), the gate dielectric 2204, the channel layers 208, the dielectric fin 904, and/or the isolation feature 402, which may also be exposed during the etching process. The first inner spacer 1402 is removed between each channel region 208 and also from the space interposing the channel region 208 and the dielectric fin 904. In some implementations, the etching process continues until the etchant removes the first inner spacer 1402 abutting the gate spacer 1202 and the uppermost channel layer 208—that is the channel layer 208 closest to the frontside of the device (e.g., lowest layer in the orientation illustrated in FIG. 27A. In some other implementations, portions of the first inner spacer 1402 remain on the device 200. For example, the etching process may be stopped prior to exposure of the gate spacer 1202 maintaining a residue of the inner spacer adjacent the gate spacer 1202 and the uppermost channel layer 208. FIGS. 32A-32C are exemplary of such an embodiment. In some implementations, the second inner spacer 1502 is also removed from the device 200 (see FIGS. 31A-31C) in a same etching process or a subsequent etching process. Similarly, in a further embodiment of a process that etches both the first and second inner spacers, a residue of the second inner spacer 1502 and/or the first inner spacer 1402 may remain on the device 200. For example, the etching process may be stopped prior to exposure of the gate spacer 1202 thus maintaining a residue of the first inner spacer 1402 and the second inner spacer 1502 adjacent the gate spacer 1202 and the uppermost channel layer 208.

Figures 28A, 28B:
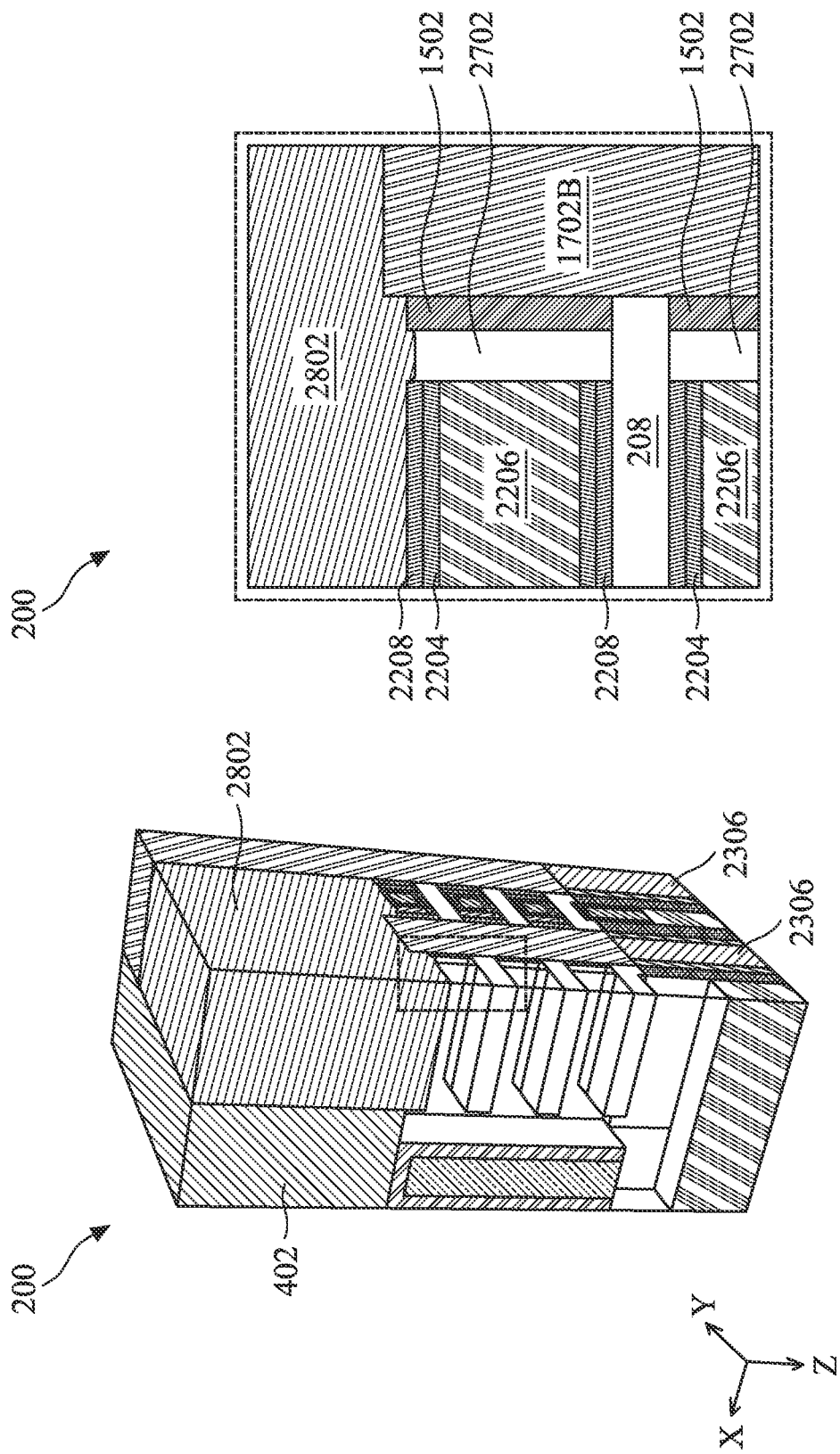

The method 100 then proceeds to block 130 where an insulating material is deposited. The insulating material may provide a seal for at least one air gap created by the removal of the inner spacer(s) or portion thereof discussed above in block 128. Referring to the example of FIGS. 28A and 28B, an insulating material layer 2802 is formed on the device 200. In some embodiments, the insulating material forming insulating material layer 2802 may include SiO2, silicon nitride, silicon oxynitride, fluorine-doped silicate glass (FSG), a low-k dielectric, combinations thereof, and/or other suitable materials known in the art. In an embodiment, the insulating material layer 2802 includes a composition also provided in the isolation structure 402. In an embodiment, the insulating material layer 2802 is a multi-layer feature. In various examples, the dielectric material may be deposited by a CVD process, a subatmospheric CVD (SACVD) process, a flowable CVD process, an ALD process, a PVD process, or other suitable process. After the deposition process, the planarization process, such as a chemical mechanical polishing (CMP) process, is performed on the materials, thereby reducing the thickness. This planarization forms a surface such as illustrated in FIG. 28A. The insulating material layer 2802, as illustrated by the detailed cross-sectional view of FIG. 28B, provides a capping or sealing of the air gaps 2702. Depending on the width of the air gap 2702, the insulating material layer 2802 may extend slightly into the air gap 2702. For example, an increased width of the air gap 2702 the greater the amount of material from the insulating material layer 2802 there is likely to be at the upper portion of the air gap 2702.

Figure 29:
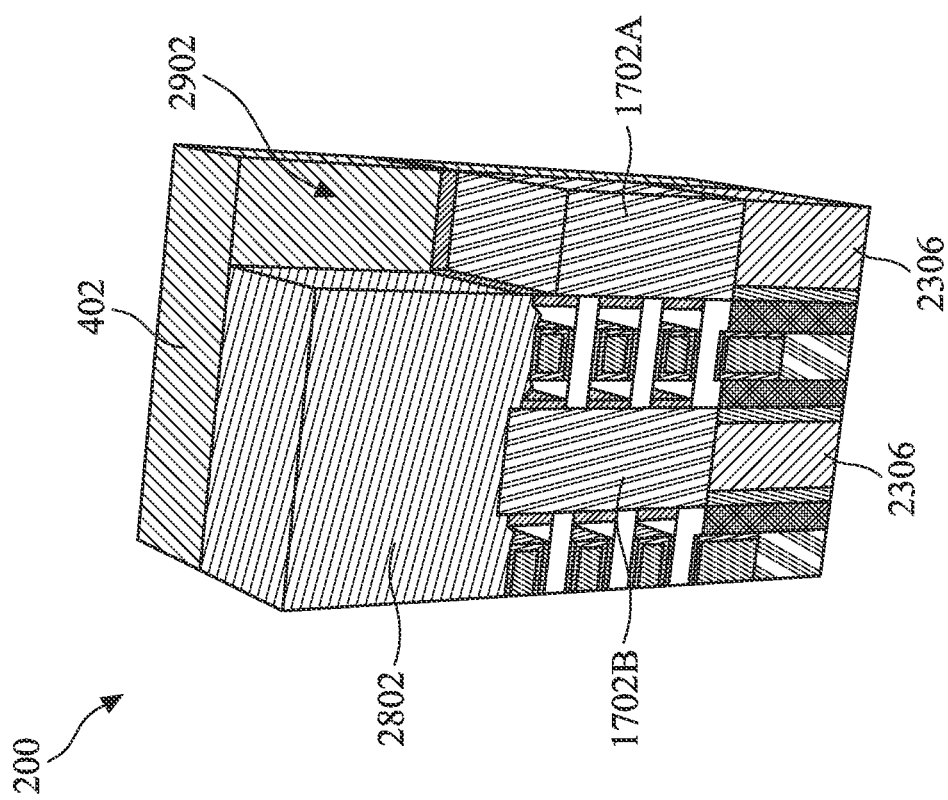

The method 100 then proceeds to block 132 where backside interconnection features are formed. In some implementations, block 132 includes etching the backside of the device by etching back one terminal, e.g., the source-side, of a GAA transistor of the device. Referring to the example of FIG. 29, the source-side is recessed to provide an opening 2902. In an embodiment, the opening 2902 is provided by a selective etching process targeting the semiconductor material of the source feature 1702A, while minimally etching the surrounding insulating layers such as isolation feature 402 and insulating material layer 2802. The insulating material layer 2802 and isolation structure 402 provide protection for the device such as the channel region. Thus, because of the selectivity of the source feature 1702A in comparison with the surrounding dielectric, a self-aligned via for contacting the source feature 1702A is possible.

After etching the backside of the device 200 to form the opening, conductive material may be deposited into the opening 2902 to form a contact to the associated source feature. Referring to the example of FIG. 30A, a contact via 3002 is formed on the backside of the device 200 interfacing the source feature 1702A. The contact via 3002 may provide electrical interconnection to the source feature 1702A. It is noted that in some embodiments, a conductive via is formed to the source feature 1702A from the frontside, but this conductive via may not be interconnected to other routing and thus, electrical interconnection is not provided to the source feature 1702A from the frontside.

Additional backside metallization may be formed interfacing with the contact via 3002 and providing electrical interconnection to the source feature 2702B. In an embodiment, a power rail metallization line 3004 is formed over the contact via 3002. It is noted that due to the topography of the backside of the device 200, including the insulating material layer 2802 and the isolation structure 402, the power rail metallization line 3004 may be of an increased width than those metallization features formed over the frontside of the device 200. In some implementations, the power rail metallization line 3004 includes Cu, Al, Co, W, Ti, Ta, Ru, and/or combinations thereof. During operation, the metallization line 3004 and the contact via 3002 provide routing for power (Vdd) or ground (Vss) in conjunction with the remaining elements of the MLI 3006, discussed below.

The contact via 3002 and/or metallization line 3004 may include a multi-layer structure such as a barrier layer, adhesion layer, bulk layer, and/or other suitable layers. The contact via 3002 and/or metallization line 3004 may be components of the MLI 3006 formed over the backside of the device. In some embodiments, above the power rail metallization line 3004 additional metallization lines, vias, and associated dielectric layers may be formed to provide portions of the backside MLI structure 3006. In the MLI 3006, various dielectric layers interpose the vertical interconnect features such as the contact via 3002 and the metallization layers such as the metallization line 3004, the various dielectric layers may include ILD layers.

Figure 30B:
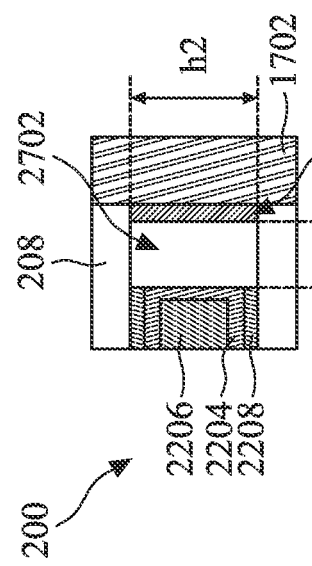
Figure 30C:
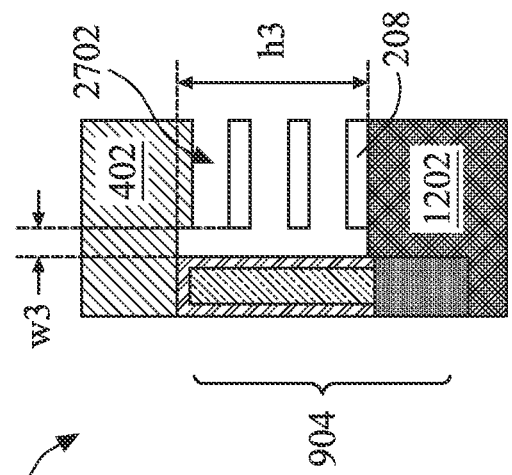
Figure 30A:
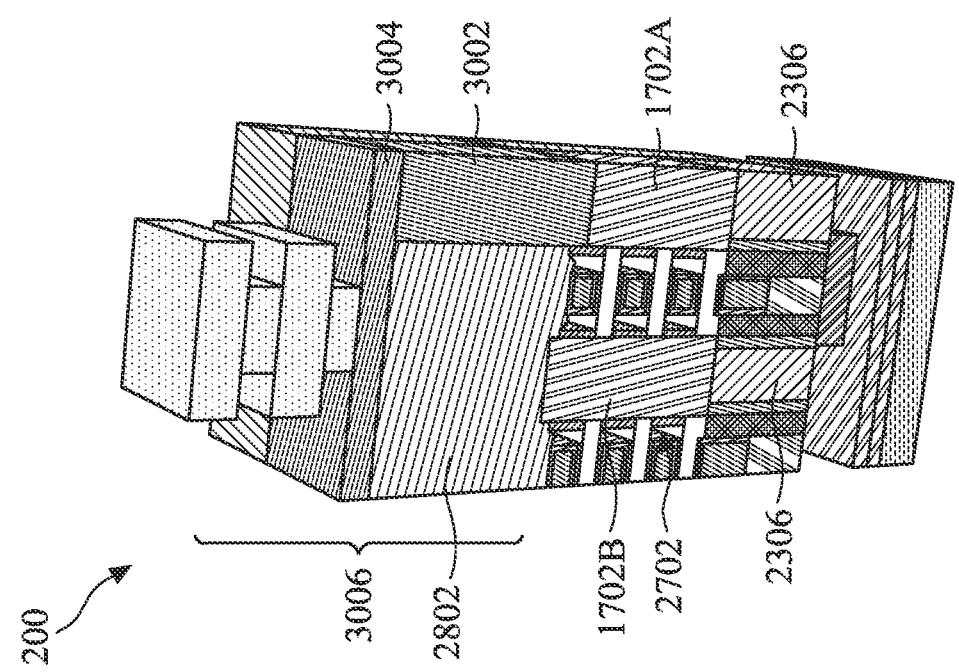

Thus, referring to FIGS. 30A, 30B, and 30C illustrated is an embodiment of the device 200 fabricated according to one or more steps of the method 100 as discussed above. The device 200 of FIGS. 30A, 30B, 30C includes an air gap 2702 having been formed by the removal of the first inner spacer 1402, in some implementations, in its entirety. The air gap 2702 extends from the second inner spacer 1502 to an edge of the gate structure 2202 and in particular the high-k gate dielectric 2204 and/or the interfacial layer 2008 in the y-direction. The air gap 2702 includes a width w2 in the y-direction, where w2 may be between approximately 1 nm and 10 nm. The air gap 2702 has a height h2 between channel layers 208, where h2 is between approximately 5 nm and 15 nm.

The air gap 2702 is also disposed between the dielectric fin 904 and the ends of the channel layers 208. The air gap extends from the end of the channel layers 208 to the first dielectric layer 702 of the dielectric fin 904 in the x-direction. The air gap 2702 has a width w3 in this x-direction of between approximately 5 nm and 20 nm. The air gap 2702 has a height h3 in the z-direction adjacent ends of the channel layers 208. The height h3 is dependent upon the number of channel layers 208 of the GAA device. It is noted that the cross-section of FIG. 30C is taken through the air gap, thus, the adjacent second inner spacer 1502 is not illustrated.

In an embodiment, the dimensions of the air gap 2702 are selected to provide the suitable performance with respect to capacitance for the device understanding the trade-offs of fabrication process challenges. In an embodiment, if the air gap width (w2) is too great, the insulating material layer 2802 may undesirably enter the air gap 2702. When the insulating material layer 2802 enters the air gap 2702, the resistance may increase due to the properties of the insulating material in comparison with those of air (e.g., dielectric constant). In an embodiment, if the air gap width (w2) is too low, insufficient amounts of air are provided and the capacitance of the device may be greater than desired. In an embodiment, if the air gap height (h2) is too great, the capacitance of the device may increase. In an embodiment, if the air gap height (h2) is too low, processing may be challenging such as, for example, performing the replacement gate process. Similarly, in an embodiment, if the air gap width (w3) to the dielectric fin 904 is too great, the capacitance of the device may increase. In an embodiment, if the air gap width (w3) to the dielectric fin 904 is too low, processing may be challenging such as, for example, performing the replacement gate process.

The second inner spacer 1502 may be have a height that is substantially the same h2 discussed above. The second inner spacer 1502 may has a width (t2 discussed above) that is between approximately 1 and 5 nanometers. In some embodiments, if the width of the second inner spacer 1502 is too great, the capacitance of the device may increase. In some embodiments, if the width of the second inner spacer 1502 is too narrow, it may be insufficient to protect the source/drain feature 1702 during the removal of the first inner spacer 1402 when forming the air gap 2702.

Figure 31B:
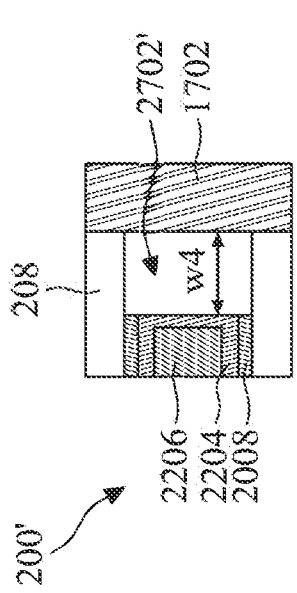
FIGS. 31A, 31B, and 31C are a fragmentary perspective view and fragmentary cross-sectional views, respectively, of another multigate device, in portion or entirety, that may be fabricated according to various aspects of the present disclosure.
Figure 31C:
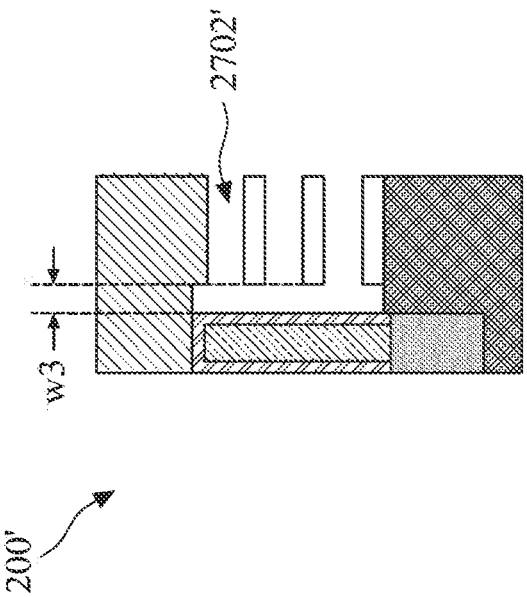
Figure 31A:
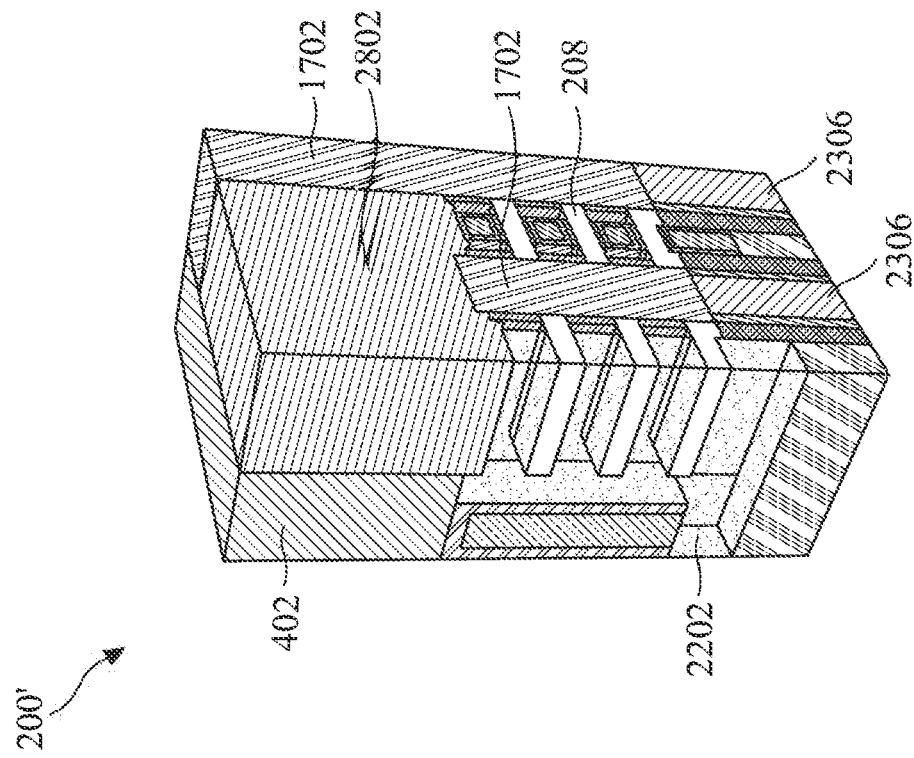
Figure 32B:
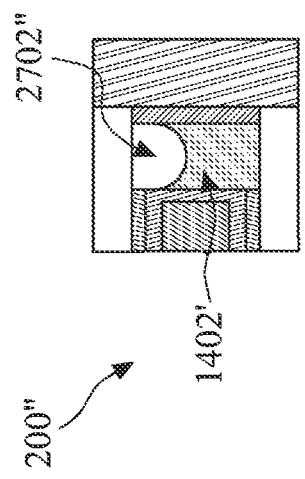
FIGS. 32A, 32B, and 32C are a fragmentary perspective view and fragmentary cross-sectional views, respectively, of another multigate device, in portion or entirety, that may be fabricated according to various aspects of the present disclosure.
Figure 32C:
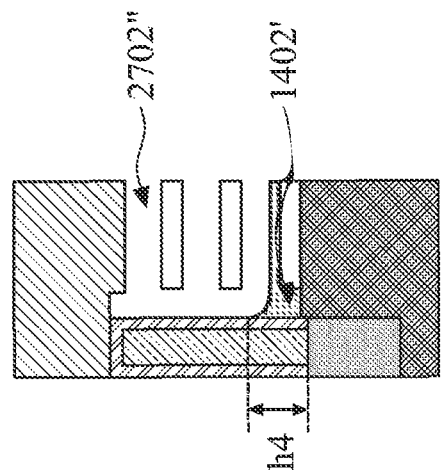
Figure 32A:
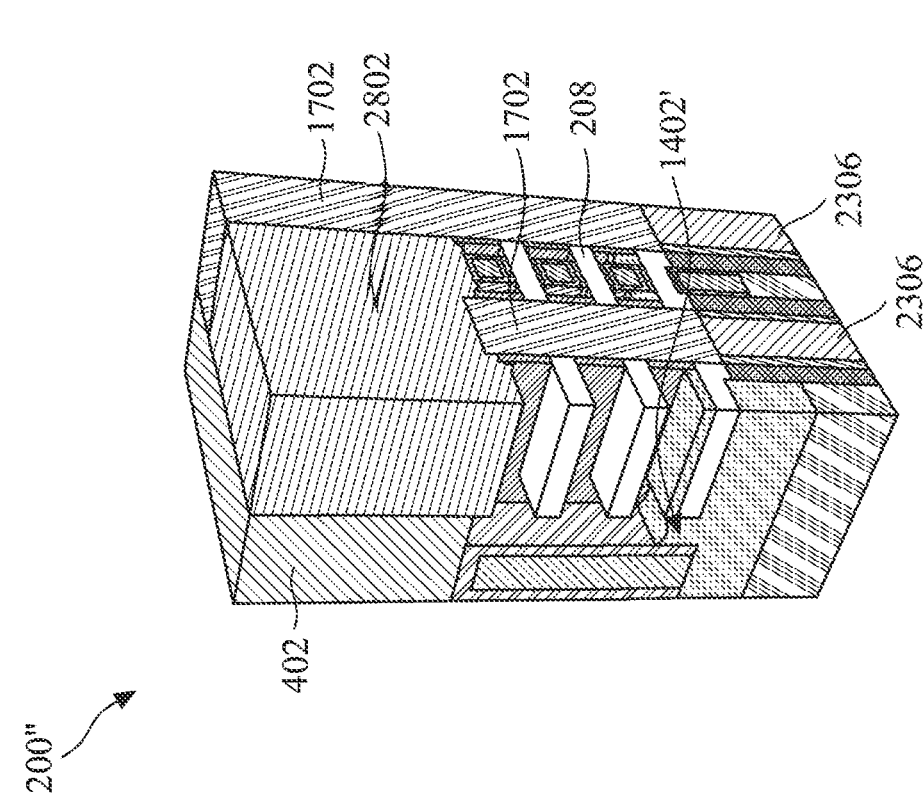

In another embodiment of the method 100, a device 200' is provided as illustrated in FIGS. 31A, 31B, and 31C. The device 200' is substantially similar to the device 200 except that in forming the air gap such as discussed above at block 128, both the first inner spacer 1402 and the second inner spacer 1502 are removed to form an air gap 2702'. The air gap 2702' extends from the source/drain feature 1702 to the gate structure 2202. In an embodiment, the air gap 2702' has a width w4 that is between approximately 2 nm and 15 nm. The air gap 2702' also extends from the ends of the channel layers 208 of the dielectric fin 904 for substantially the width w3 discussed above. The device 200' having the air gap 2702' may allow for a further reduction in capacitance, thus improving the device 200' performance, but also may provide for exposure of the sidewalls of the source/drain features 1702 during the removal process that may provide additional risk of damage.

In some embodiments, to form the device 200', at block 128 of the method 100, one or more etching processes may be performed to selectively remove the first spacer element 1402 and the second spacer element 1502 concurrently or sequentially. In some embodiments, the first inner spacer 1402 and the second inner spacer 1502 are removed in their entirety. In other embodiments, a residue of one or both of the first inner spacer 1402 and the second inner spacer 1502 may remain on the device, such as discussed below with reference to the device 200".

In another embodiment of the method 100, a device 200" is provided as illustrated in FIGS. 32A, 32B, and 32C. The device 200" is substantially similar to the device 200 except that in forming the air gap such as discussed above at block 128 of the method 100, only a portion (e.g., less than all) of the first inner spacer 1402 is removed to form the air gap 2702", while a portion of the first inner spacer, illustrated as residue 1402' is maintained in the device. In some implementations, the residue 1402' remains adjacent the uppermost channel layer 208, in other words, the channel portion closest to the frontside of the device 200. This is because the etchant enters from the backside of the device (see opening 2602 of FIG. 26A) and the material furthest from the etchant entrance is the last etched, and thus, provides the residue 1402'. In an embodiment, the residue 1402' has a thickness of height (h4) between approximately 0 nm and approximately 30 nm. The device 200" having the air gap 2702" may result in decreased device performance (e.g., increase in capacitance), but also may reduce the likelihood of damage due to the etching process of block 128, decrease the processing time of block 128, and/or may provide additional structural rigidity. Note that in some embodiments, a surface of the upper-most channel layer 208 may be covered in its entirety or a portion of the surface of the channel layer 208 may be exposed in one of the y-direction or x-direction.

Figure 33:
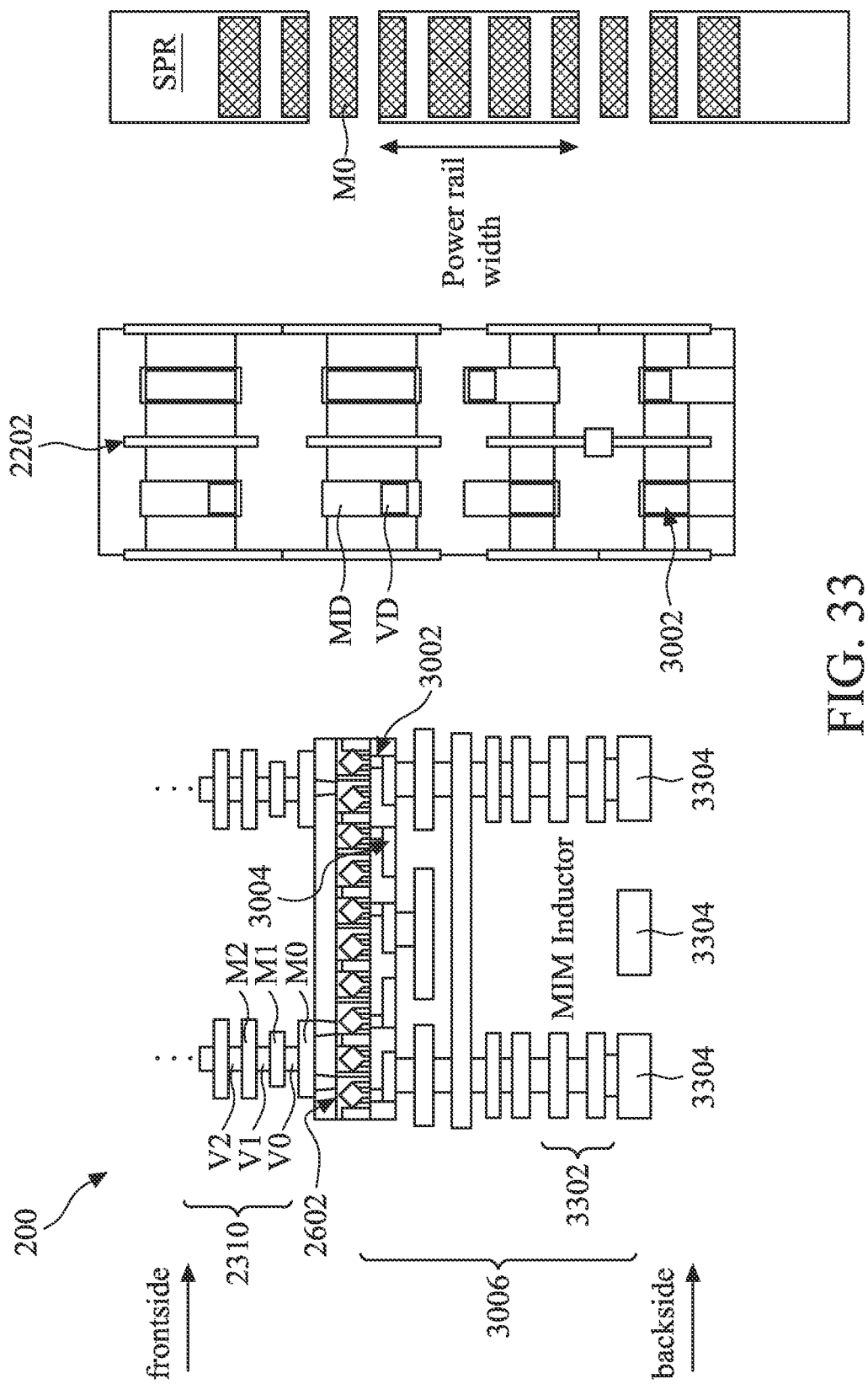
FIG. 33 is an outline drawing of an implementation of a device according to one or more aspects of the present disclosure.

FIG. 33 is outline drawing of the multigate device 200 having a plurality of gate structures 2202 and source/drain features 1702 illustrated in layout form and cross-sectional view. As illustrated certain source/drain features 1702 are interconnected a contact via 3002 on the backside, which is connected to a metallization 3004 that in some implementations provides a power rail. The metallization 3004 is provided in comparison with a width M0 (e.g., lowest metal line layer) of the frontside MLI 2310 on the frontside of the device. The metallization layer 3004 may be part of the backside MLI 3006 and interconnected to a MIM inductor device 3302 and/or a backside input-out (I/O) pad, a backside Vdd pad, and/or backside ground (GND) pads 3304 formed on the backside of the device. In an embodiment, the metallization 3004 includes Cu, Al, Co, W, Ti, Ta, Ru, and/or combinations thereof.

Thus, provided is methods and devices that allow in some implementations for a reduced capacitance, while providing a backside metallization scheme (e.g., power line) that experiences reduced resistance by an increase in width of the metal line. The methods and devices allow for an air gap to be formed adjacent the channel region, thus reducing the dielectric constant of the insulating material to that of air. From the foregoing description, it can be seen that multigate devices described in the present disclosure offer advantages over conventional multigate devices. It is understood, however, that other embodiments may offer additional advantages, and not all advantages are necessarily disclosed herein, and that no particular advantage is required for all embodiments. The present disclosure provides for many different embodiments.

An exemplary device described herein includes a multigate device having: a channel layer disposed between a source feature and a drain feature, a metal gate that surrounds the channel layer, and a first air gap spacer interposing the metal gate and the source feature and a second air gap spacer interposing the metal gate and the drain feature. A backside contact extends to the source feature. A power line metallization layer is connected to the backside contact.

In a further embodiment, the device includes a dielectric fin between the metal gate and another metal gate. In an embodiment, the first air gap spacer extends from a gate dielectric layer of the metal gate to the dielectric fin. In an embodiment, the device also includes a low-k dielectric layer between the metal gate and the dielectric fin and adjacent the first air gap spacer. In some implementations, a frontside contact is formed to the drain feature. In an embodiment, the device includes a residue of dielectric material adjacent the first air gap spacer and abutting a second channel layer where the metal gate surrounds the second channel layer. In a further implementation, the residue abuts spacer elements on sidewalls of the metal gate. In an embodiment, the width of the first air gap spacer between the source feature and the metal gate is between approximately 1 nanometer and 10 nanometers.

In another of the broader embodiments, a device is provided that includes an isolation feature disposed over a substrate. The isolation feature is disposed between a first fin portion and a second fin portion extending from the substrate, a dielectric gate isolation fin disposed over the isolation feature, wherein the dielectric gate isolation fin, and a first gate structure around a first channel layer and a second channel layer over the first channel layer. The first channel layer and the second channel layer are disposed over the first fin portion and extend between a first source feature and a first drain feature. The device includes gate spacers abutting sidewalls of a portion of the first gate structure. The gate spacers being disposed on the second channel layer. An air gap is disposed between the second channel layer and the first channel layer and between the first gate structure and the first source feature. A dielectric material residue is between the first channel layer and the second channel layer adjacent the air gap.

In a further embodiment, the first gate structure of the device is formed around a third channel layer under the first channel layer, and the air gap extends from the first channel layer to the third channel layer. In an embodiment, the device includes a low-k dielectric material adjacent the dielectric material residue. The low-k dielectric material interposes the air gap and the first source feature. In an embodiment, the device further includes a dielectric fin having a first portion of a surface abutting the first gate structure and a second portion of the surface abutting the air gap. In an embodiment, the device includes a first contact element to the first source feature from a backside of the device, a second contact element to the first drain feature from a frontside of the device, and a power rail metallization line interfacing the first contact element.

In another of the broader embodiments discussed herein, a method is provided that includes providing a structure having a frontside and a backside. A gate-all-around (GAA) device is formed on the frontside of the structure. Forming the GAA device includes etching a plurality of alternating layers to form a fin structure; forming inner spacers including a dummy dielectric material and a low-k dielectric material between channel layers of the fin structures; epitaxially growing a source/drain feature adjacent a first side of the inner spacers; releasing the channel layers in a channel region of the fin structure adjacent a second side of the inner spacers, the second side opposing the first side; and forming a metal gate structure between the channel layers. After forming the GAA device, the structure is flipped to remove a portion of substrate exposing the dummy dielectric material. The dummy dielectric material is removed to form an air gap. An insulating material layer is deposited on the backside of the structure over the air gap.

In a further embodiment, the method further includes removing the low-k dielectric material after forming the GAA device to form a portion of the air gap. In an embodiment, after the removing the dummy dielectric material to form the air gap, a portion of the dummy dielectric material remains adjacent the air gap. In some implementations, the portion of the dummy dielectric material interfaces gate spacers. In an embodiment, the method includes forming a contact to the source/drain feature from a backside of the device after forming the air gap. The method may include forming the contact includes forming a via to interface a metallization layer formed on the backside of the structure and connecting the metallization layer to a power source. In some embodiments, forming the metal gate structure includes forming a high-k dielectric interfacing the dummy dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a multigate device having:
a channel layer disposed between a source feature and a drain feature,
a metal gate that surrounds the channel layer,
a first air gap spacer interposing the metal gate and the source feature and a second air gap spacer interposing the metal gate and the drain feature;
a frontside contact to the drain feature;
a backside contact extending to the source feature; and
a power line metallization layer connected to the backside contact.

2. The device of claim 1, further comprising a dielectric fin between the metal gate and another metal gate.

3. The device of claim 2, wherein the first air gap spacer extends from a gate dielectric layer of the metal gate to the dielectric fin.

4. The device of claim 2, further comprising: a low-k dielectric layer between the metal gate and the dielectric fin and adjacent the first air gap spacer.

5. The device of claim 1, further comprising: a residue of dielectric material adjacent the first air gap spacer and abutting a second channel layer, wherein the metal gate surrounds the second channel layer.

6. The device of claim 5, wherein the residue abuts spacer elements on sidewalls of the metal gate.

7. The device of claim 1, wherein a width of the first air gap spacer between the source feature and the metal gate is between 1 nanometer and 10 nanometers.

8. A device comprising:
an isolation feature disposed over a substrate, wherein the isolation feature is disposed between a first fin portion and a second fin portion extending from the substrate;
a dielectric gate isolation fin disposed over the isolation feature, wherein the dielectric gate isolation fin;
a first gate structure around a first channel layer and a second channel layer over the first channel layer, wherein the first channel layer and the second channel layer are disposed over the first fin portion and extend between a first source feature and a first drain feature;
gate spacers abutting sidewalls of a portion of the first gate structure, the gate spacers being disposed on the second channel layer;
an air gap between the second channel layer and the first channel layer and between the first gate structure and the first source feature; and
a dielectric material residue between the first channel layer and the second channel layer adjacent the air gap.

9. The device of claim 8, wherein the first gate structure is formed around a third channel layer under the first channel layer, and the air gap extends from the first channel layer to the third channel layer.

10. The device of claim 8, further comprising: a low-k dielectric material adjacent the dielectric material residue, wherein the low-k dielectric material interposes the air gap and the first source feature.

11. The device of claim 8, further comprising: a dielectric fin having a first portion of a surface abutting the first gate structure and a second portion of the surface abutting the air gap.

12. The device of claim 8, further comprising:
a first contact element to the first source feature from a backside of the device,
a second contact element to the first drain feature from a frontside of the device,
a power rail metallization line interfacing the first contact element.

13. The device of claim 8 wherein the dielectric material residue has an upper surface disposed between the first channel layer and the second channel layer.

14. The device of claim 8 wherein the dielectric material residue comprising silicon and nitrogen.

15. A device comprising:
a multigate device having:
a channel layer disposed between a source feature and a drain feature;
the source feature and the drain feature comprising epitaxial material;
a metal gate that surrounds the channel layer and is disposed between the source feature and the drain feature; and
a first air gap extending from a first sidewall of the metal gate to the source feature and a second air gap extending from a second sidewall of the metal gate to the drain feature, wherein a surface of the channel layer defines an edge of the first air gap.

16. The device of claim 15, further comprising: a dielectric material residue defining another edge of the first air gap.

17. The device of claim 15, further comprising:
a backside contact extending to the source feature; and
a power line metallization layer connected to the backside contact.

18. The device of claim 17, further comprising:
a frontside contact to the drain feature.

19. The device of claim 15, wherein the channel layer is a nanostructure.

20. The device of claim 1, wherein the metal gate interfaces at least two surfaces of the channel layer.

* * * * *